US012575298B2

(12) United States Patent
Lee et al.

(10) Patent No.: US 12,575,298 B2
(45) Date of Patent: Mar. 10, 2026

(54) GUIDE FILM, METHOD OF FABRICATING THE GUIDE FILM, AND APPARATUS FOR AND METHOD OF FABRICATING DISPLAY DEVICE

(71) Applicant: Samsung Display Co., LTD., Yongin-si (KR)

(72) Inventors: Sang Won Lee, Seoul (KR); Jong Deok Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/753,583

(22) Filed: Jun. 25, 2024

(65) Prior Publication Data

US 2024/0343030 A1 Oct. 17, 2024

Related U.S. Application Data

(62) Division of application No. 17/963,521, filed on Oct. 11, 2022, now Pat. No. 12,049,068, which is a
(Continued)

(30) Foreign Application Priority Data

Jun. 8, 2020 (KR) ........................ 10-2020-0069103

(51) Int. Cl.
*B32B 7/12* (2006.01)
*B32B 37/12* (2006.01)
(Continued)

(52) U.S. Cl.
CPC ........... *H10K 59/8722* (2023.02); *B32B 7/12* (2013.01); *B32B 37/12* (2013.01);
(Continued)

(58) Field of Classification Search
CPC ........ B32B 2457/20; B32B 2310/0831; B32B 27/08; B32B 7/06; B32B 3/085;
(Continued)

(56) References Cited

U.S. PATENT DOCUMENTS 9,650,546 B2 5/2017 Yamamoto et al.
10,141,540 B2 11/2018 Sung et al.
(Continued)

FOREIGN PATENT DOCUMENTS

CN 104769064 A 7/2015
CN 107492561 A 12/2017
(Continued)

OTHER PUBLICATIONS

Office Action for Chinese Application No. 202110630262.6 issued Jul. 29, 2025. 11 pages. (see p. 9-10, categorizing the cited references).
(Continued)

*Primary Examiner* — Vishal I Patel
(74) *Attorney, Agent, or Firm* — Lerner David LLP

(57) ABSTRACT

A method of fabricating a display device includes preparing a display panel including a main display area, a first edge area, a second edge area, a third edge area, a fourth edge area, a driving chip, and a printed circuit film; and disposing the display panel on a guide film, which is provided on a shaping pad. The guide film includes a main film portion which overlaps with the main display area, a first film portion, a second film portion, a third film portion, a fourth film portion, and a first ultraviolet absorption pattern which is attached to the fourth film portion.

3 Claims, 30 Drawing Sheets

Related U.S. Application Data division of application No. 17/154,668, filed on Jan. 21, 2021, now Pat. No. 11,491,773.

(51) Int. Cl.

| | |
|---|---|
| *B32B 38/00* | (2006.01) |
| *H10K 59/80* | (2023.01) |
| *H10K 71/40* | (2023.01) |
| *B32B 3/02* | (2006.01) |
| *B32B 3/08* | (2006.01) |
| *B32B 7/06* | (2019.01) |
| *B32B 27/08* | (2006.01) |

(52) U.S. Cl.

CPC ...... *B32B 38/0008* (2013.01); *B32B 38/0012* (2013.01); *H10K 71/40* (2023.02); *B32B 3/02* (2013.01); *B32B 3/085* (2013.01); *B32B 7/06* (2013.01); *B32B 27/08* (2013.01); *B32B 2310/0831* (2013.01); *B32B 2457/20* (2013.01)

(58) Field of Classification Search

CPC ... B32B 3/02; B32B 38/0012; B32B 38/0008; B32B 37/12; B32B 7/12; H10K 71/40; H10K 59/8722

See application file for complete search history.

(56) References Cited

U.S. PATENT DOCUMENTS

| | | | |
|---|---|---|---|
| 10,411,219 | B2 | 9/2019 | Sung et al. |
| 10,748,973 | B2 | 8/2020 | Han et al. |
| 10,763,454 | B2 | 9/2020 | Sung et al. |
| 10,782,746 | B2 | 9/2020 | Kleeman et al. |
| 10,861,908 | B2 | 12/2020 | Seomoon et al. |
| 11,099,413 | B2 | 8/2021 | Aoki et al. |
| 11,195,891 | B2 | 12/2021 | Han et al. |
| 11,198,271 | B2 | 12/2021 | Kim et al. |
| 11,289,686 | B2 | 3/2022 | Jung et al. |
| 11,307,685 | B2 | 4/2022 | Jung et al. |
| 11,362,305 | B2 | 6/2022 | Sung et al. |
| 11,398,533 | B2 | 7/2022 | Seomoon et al. |
| 11,657,736 | B2 | 5/2023 | Ahn et al. |
| 11,667,106 | B2 | 6/2023 | Kim et al. |
| 11,925,062 | B2 | 3/2024 | Han et al. |
| 12,049,072 | B2 | 7/2024 | Kim et al. |
| 2016/0009024 | A1 | 1/2016 | Mason |
| 2019/0004360 | A1 | 1/2019 | Aoki et al. |
| 2019/0107755 | A1 | 4/2019 | Chen |
| 2019/0329540 | A1 | 10/2019 | Kim et al. |
| 2020/0098795 | A1 | 3/2020 | Jung et al. |
| 2020/0160761 | A1* | 5/2020 | Ahn .................... G09F 9/301 |
| 2021/0058691 | A1 | 2/2021 | Kim et al. |
| 2021/0074773 | A1 | 3/2021 | Seomoon et al. |
| 2021/0280096 | A1 | 9/2021 | Ahn et al. |
| 2024/0351308 | A1 | 10/2024 | Kim et al. |

FOREIGN PATENT DOCUMENTS

| | | |
|---|---|---|
| CN | 108110030 A | 6/2018 |
| CN | 109212804 A | 1/2019 |
| CN | 109658817 A | 4/2019 |
| CN | 110400825 A | 11/2019 |
| CN | 110851009 A | 2/2020 |
| CN | 111199996 A | 5/2020 |
| KR | 2003-0044038 | 6/2003 |
| KR | 10-0658267 | 12/2006 |
| KR | 10-2019-0123830 | 11/2019 |
| KR | 10-2019-0124358 | 11/2019 |
| KR | 10-2019-0130105 | 11/2019 |
| KR | 10-2020-0021581 | 3/2020 |
| KR | 10-2020-0058638 | 5/2020 |

OTHER PUBLICATIONS

Extended European search report for European Patent Application or Patent No. 21178114.1 dated Oct. 26, 2021.

* cited by examiner

FIG. 2
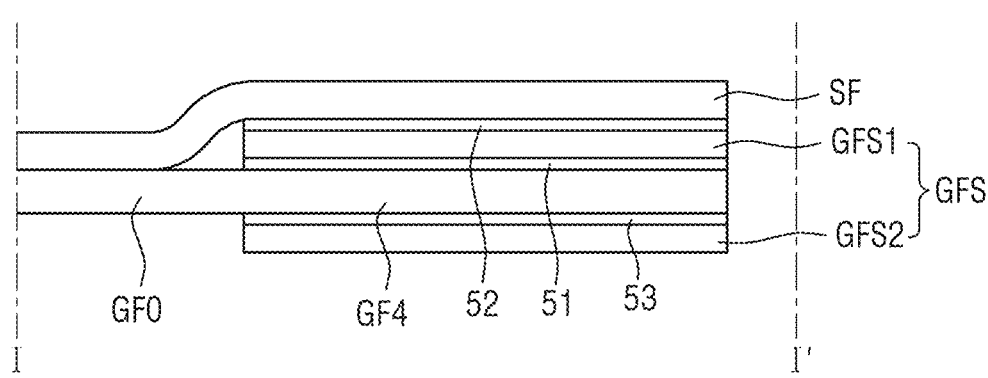
DR3

FIG. 3
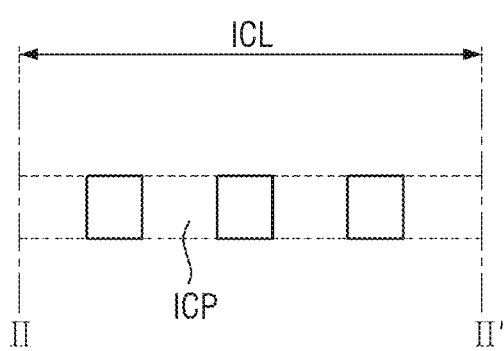

FIG. 14

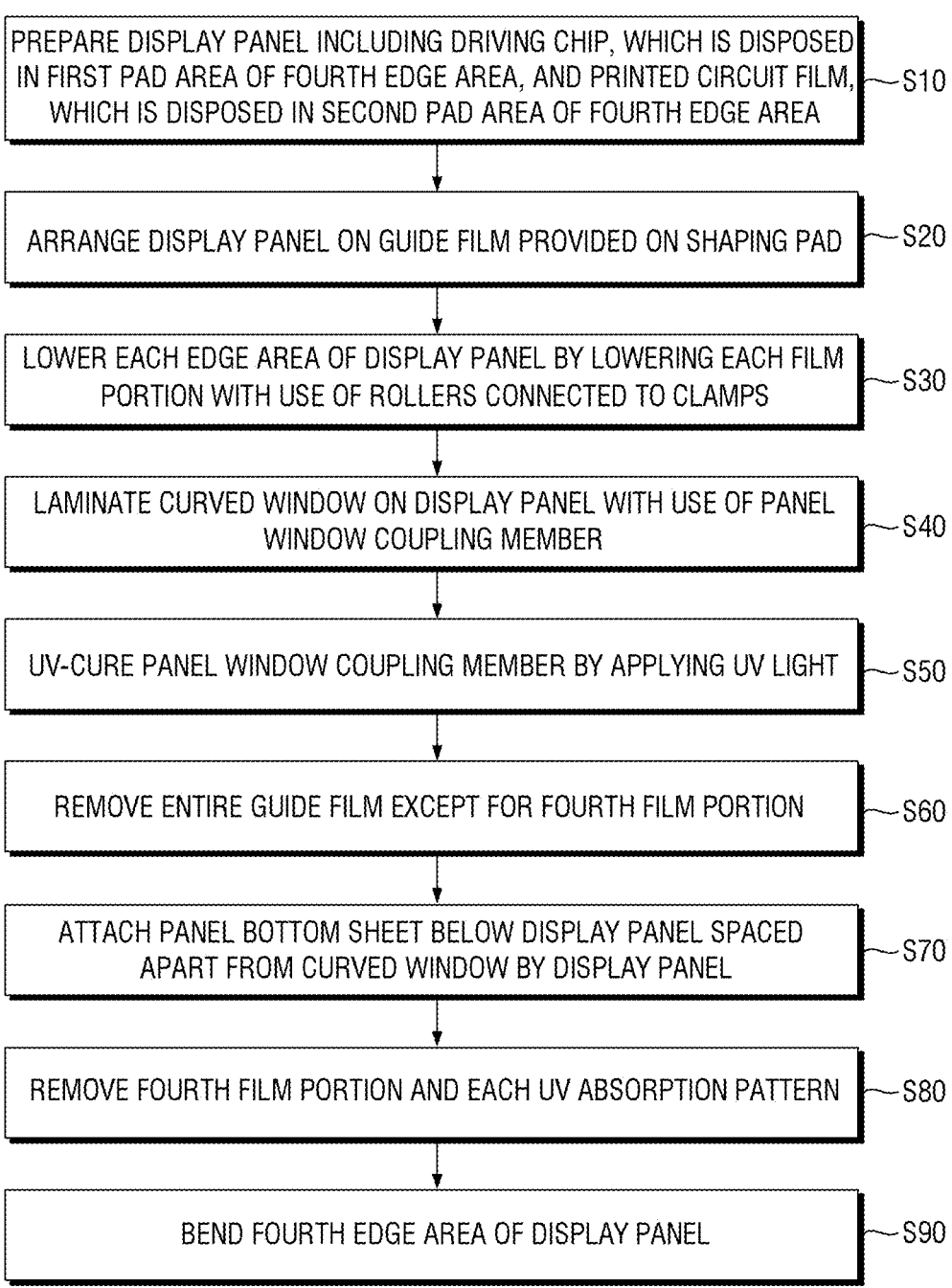

PREPARE DISPLAY PANEL INCLUDING DRIVING CHIP, WHICH IS DISPOSED IN FIRST PAD AREA OF FOURTH EDGE AREA, AND PRINTED CIRCUIT FILM, WHICH IS DISPOSED IN SECOND PAD AREA OF FOURTH EDGE AREA ~S10

ARRANGE DISPLAY PANEL ON GUIDE FILM PROVIDED ON SHAPING PAD ~S20

LOWER EACH EDGE AREA OF DISPLAY PANEL BY LOWERING EACH FILM PORTION WITH USE OF ROLLERS CONNECTED TO CLAMPS ~S30

LAMINATE CURVED WINDOW ON DISPLAY PANEL WITH USE OF PANEL WINDOW COUPLING MEMBER ~S40

UV-CURE PANEL WINDOW COUPLING MEMBER BY APPLYING UV LIGHT ~S50

REMOVE ENTIRE GUIDE FILM EXCEPT FOR FOURTH FILM PORTION ~S60

ATTACH PANEL BOTTOM SHEET BELOW DISPLAY PANEL SPACED APART FROM CURVED WINDOW BY DISPLAY PANEL ~S70

REMOVE FOURTH FILM PORTION AND EACH UV ABSORPTION PATTERN ~S80

BEND FOURTH EDGE AREA OF DISPLAY PANEL ~S90

FIG. 16
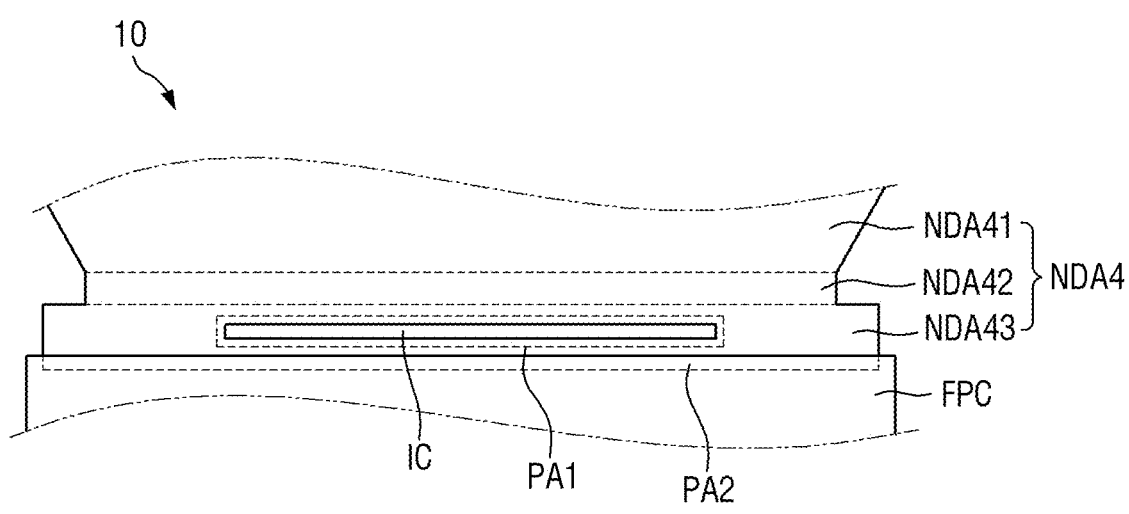
10
NDA41
NDA42  } NDA4
NDA43
FPC
IC    PA1    PA2
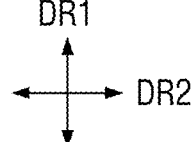
DR1
DR2

GF: GF0, GF1, GF2, GF3, GF4, GFS
30: CL1, CL2, CL3, CL4, GR1, GR2, GR3, GR4, SP, ST

GF: GF0, GF1, GF2, GF3, GF4, GFS
30: CL1, CL2, CL3, CL4, GR1, GR2, GR3, GR4, SP, ST

GF: GF0, GF1, GF2, GF3, GF4, GFS
30: CL1, CL2, CL3, CL4, GR1, GR2, GR3, GR4, SP, ST

GF: GF0, GF1, GF2, GF3, GF4, GFS
30: CL1, CL2, CL3, CL4, GR1, GR2, GR3, GR4, SP, ST

GUIDE FILM, METHOD OF FABRICATING THE GUIDE FILM, AND APPARATUS FOR AND METHOD OF FABRICATING DISPLAY DEVICE

CROSS-REFERENCE TO RELATED APPLICATION(S)

This is a divisional application of U.S. patent application Ser. No. 17/963,521 filed Oct. 11, 2022 (now pending), the disclosure of which is incorporated herein by reference in its entirety. U.S. patent application Ser. No. 17/963,521 is a divisional application of U.S. patent application Ser. No. 17/154,668, filed Jan. 21, 2021, now U.S. Pat. No. 11,491,773, issued Nov. 8, 2022, the disclosure of which is incorporated herein by reference in its entirety. U.S. patent application Ser. No. 17/154,668 claims priority to and the benefit of Korean Patent Application No. 10-2020-0069103 under 35 U.S.C. § 119, filed in the Korean Intellectual Property Office on Jun. 8, 2020, the entire contents of which are incorporated herein by reference.

BACKGROUND

1. Technical Field

The disclosure relates to a guide film, a method of fabricating the guide film, and an apparatus for and method of fabricating a display device.

2. Description of the Related Art

Electronic devices that provide images to users, such as smartphones, tablet personal computers (PCs), digital cameras, notebook computers, navigation devices, and smart televisions (TVs) include display devices capable of displaying images. A typical display device includes a display panel, which creates and displays an image, and various input devices.

An organic light-emitting diode (OLED) display device, which is a type of display device, displays an image using OLEDs by creating light via the recombination of electrons and holes. The OLED display device can provide an excellent response speed, a high luminance, and a wide viewing angle and can be driven at low power.

Display devices generally display images at the front thereof, and recently, curved display devices having curved sides and thereby capable of displaying images even on the curved sides have been developed. A curved display device includes a curved window and a curve display panel attached to the curved window.

SUMMARY

Embodiments of the disclosure provide a method of fabricating a display device having minimized the movement of the bending area of a curved display panel during the fabrication of a curved display device.

Embodiments of the disclosure also provide a guide film capable of preventing the movement of the bending area of a curved display panel during the fabrication of a curved display device.

Embodiments of the disclosure also provide a method of fabricating a guide film capable of preventing the movement of the bending area of a curved display panel during the fabrication of a curved display device.

Embodiments of the disclosure also provide an apparatus for fabricating a display device, which is capable of preventing the movement of the bending area of a curved display panel during the fabrication of a curved display device.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to an embodiment, a method of fabricating a display device may comprise preparing a display panel including a main display area, a first edge area which is on a first side of the main display area in a first direction, a second edge area which is on a second side of the main display area in the first direction, a third edge area which is on a first side of the main display area in a second direction that intersects the first direction, a fourth edge area which is on a second side of the main display area in the second direction, a driving chip which is disposed in a first pad area of the fourth edge area, and a printed circuit film which is disposed in a second pad area of the fourth edge area; and disposing the display panel on a guide film which is provided on a shaping pad, wherein the guide film includes a main film portion which overlaps the main display area, a first film portion which is disposed on a first side of the main film portion in the first direction and overlaps the first edge area, a second film portion which is disposed on a second side of the main film portion in the first direction and overlaps the second edge area, a third film portion which is disposed on a first side of the main film portion in the second direction and overlaps the third edge area, a fourth film portion which is disposed on a second side of the main film portion in the second direction and overlaps the fourth edge area, and a first ultraviolet absorption pattern which is attached to the fourth film portion.

The first ultraviolet absorption pattern may include an ultraviolet absorbing material.

The guide film may include a first coupling member which is disposed on a first surface of the main film portion, a first surface of the first film portion, a first surface of second film portion, a first surface of third film portion, and a first surface of fourth film portion. The first coupling member may be disposed between the first ultraviolet absorption pattern and the fourth film portion and may include an ultraviolet-curable adhesive.

The guide film may include a second coupling member which is spaced apart from the first coupling member by the first ultraviolet absorption pattern, and the second coupling member may include an ultraviolet-incurable adhesive.

The guide film may include a second ultraviolet absorption pattern which is disposed on a second surface of the fourth film that is opposite to the first surface of the fourth film portion; and a third coupling member which is disposed between the second ultraviolet absorption pattern and the second surface of the fourth film portion. The third coupling member may include the ultraviolet-incurable adhesive.

The disposing of the display panel may comprise attaching the guide film except for the fourth film portion onto the display panel via the first coupling member; and attaching the first ultraviolet absorption pattern onto the fourth edge area via the second coupling member.

The disposing of the display panel may comprise fixing a part of the first film portion, a part of second film portion, a part of third film portion, and a part of fourth film portion by clamps.

The method may further comprise bending the first, second, third, and fourth edge areas of the display panel from the main display area by lowering the guide film except for the main film portion by using guide rollers which are connected to the clamps.

The method may further comprise laminating a window which is curved on the display panel by using a window coupling member.

The method may further comprise ultraviolet-curing the panel window coupling member by applying ultraviolet light.

The method may further comprise removing the guide film except for the fourth film portion.

The method may further comprise attaching a panel bottom sheet which is spaced apart from the window by the display panel onto the display panel.

The method may further comprise removing the fourth film portion and the first and second ultraviolet absorption patterns.

The method may further comprise bending the fourth edge area.

The guide film may include a first coupling member which is disposed on a first surface of the main film portion, a first surface of the first film portion, a first surface of the second film portion, a first surface of the third film portion, and a first surface of the fourth film portion, and a second coupling member which is disposed between the first ultraviolet absorption pattern and the fourth film portion, the first coupling member includes an ultraviolet-curable adhesive, the second coupling member includes an ultraviolet-incurable adhesive, and the disposing of the display panel may comprise attaching the guide film to the display panel via the first coupling member.

The method may further comprise laminating a window which is curved on the display panel by using a panel window coupling member.

The method may further comprise removing the guide film except for the fourth film portion.

The method may further comprise attaching a panel bottom sheet which is spaced apart from the window by the display panel onto the display panel.

The method may further comprise removing the first ultraviolet absorption pattern and then removing the fourth film portion by applying ultraviolet light.

According to another embodiment, a guide film may comprise a main film portion; a first film portion disposed on a first side of the main film portion in a first direction; a second film portion disposed on a second side of the main film portion in the first direction; a third film portion disposed on a first side of the main film portion in a second direction that intersects the first direction; a fourth film portion disposed on a second side of the main film portion in the second direction; and a first ultraviolet absorption pattern attached to the fourth film portion.

The first ultraviolet absorption pattern may include an ultraviolet absorbing material.

The guide film may further comprise a first coupling member disposed on a first surface of the main film portion, a first surface of the first film portion, a first surface of the second film portion, a first surface of the third film portion, and a first surface of the fourth film portion. The first coupling member may be disposed between the first ultraviolet absorption pattern and the fourth film portion and may include an ultraviolet-curable adhesive.

The guide film may further comprise a second coupling member spaced apart from the first coupling member by the first ultraviolet absorption pattern; and a release film disposed on the first and second coupling members. The second coupling member may include an ultraviolet-incurable adhesive.

The guide film may further comprise a second ultraviolet absorption pattern disposed on a second surface of the fourth film portion that is opposite to the first surface of the fourth film portion; and a third coupling member disposed between the second ultraviolet absorption pattern and the second surface of the fourth film portion. The third coupling member may include the ultraviolet-incurable adhesive.

The guide film may further comprise an incision line extending along a boundary between the fourth film portion and the main film portion. The incision line may include a plurality of incision patterns, and the plurality of incision patterns may penetrate the boundary between the fourth film portion and the main film portion in a thickness direction of the guide film.

A planar size of the first ultraviolet absorption pattern may be equal to a planar size of the fourth film portion.

The guide film may further comprise a first coupling member disposed on a first surface of the main film portion, a first surface of the first film portion, a first surface of the second film portion, a first surface of the third film portion, and a first surface of the fourth film portion; a release film attached to the first coupling member; and a second coupling member disposed between the first ultraviolet absorption pattern and the fourth film portion. The first coupling member may include an ultraviolet-curable adhesive, and the second coupling member may include an ultraviolet-incurable adhesive.

According to still another embodiment, a method of fabricating a guide film may comprise forming a guide film to include a main film portion, a first film portion disposed on a first side of the main film portion in a first direction, a second film portion disposed on a second side of the main film portion in the first direction, a third film portion disposed on a first side of the main film portion in a second direction that intersects the first direction, and a fourth film portion disposed on a second side of the main film portion in the second direction; forming an incision line to include a plurality of incision patterns along a boundary between the main film portion and the fourth film portion; and attaching ultraviolet absorption patterns onto the fourth film portion.

The plurality of incision patterns may penetrate the boundary between the main film portion and the fourth film portion in a thickness direction of the guide film, and the ultraviolet absorption patterns may include an ultraviolet absorbing material.

The ultraviolet absorption patterns may be disposed on and below the fourth film portion.

According to yet another embodiment, an apparatus for fabricating a display device may comprise a stage; a shaping pad on the stage; a guide film on the shaping pad; at least one clamp fixing a part of the guide film; and at least one guide roller connected to the at least one clamp and disposed on the guide film. The guide film may include a main film portion, a first film portion disposed on a first side of the main film portion in a first direction, a second film portion disposed on a second side of the main film portion in the first direction, a third film portion disposed on a first side of the main film portion in a second direction that intersects the first direction, a fourth film portion disposed on a second side of the main film portion in the second direction, and a first ultraviolet absorption pattern attached to the fourth film portion.

The shaping pad may include a flexible material.

The main film portion may overlap the shaping pad in a thickness direction of the guide film.

The at least one clamp may comprise a plurality of clamps, and the plurality of clamps may apply a tensile force to and fix a part of the first film portion, a part the second film portion, a part the third film portion, and a part the fourth film portion.

The at least one guide roller may comprise a plurality of guide rollers, and the plurality of guide rollers may be connected to the plurality of clamps and are disposed between the main film portion and the first, second, and third film portions.

The plurality of guide rollers may lower the first, second, and third film portions.

The first ultraviolet absorption pattern may include an ultraviolet absorbing material, the guide film may include a first coupling member disposed on first surfaces of the first, second, third, and fourth film portions, the first coupling member may be disposed between the first ultraviolet absorption pattern and the fourth film portion, and the first coupling member may include an ultraviolet-curable adhesive.

The guide film may include a second coupling member spaced apart from the first coupling member by the first ultraviolet absorption pattern, and a release film disposed on the first and second coupling members, and the second coupling member may include an ultraviolet-incurable adhesive.

The guide film may include a second ultraviolet absorption pattern disposed on a second surface of the fourth film portion that is opposite to the first surface of the fourth film portion, and a third coupling member disposed between the second ultraviolet pattern and the fourth film portion, and the third coupling member may include the ultraviolet-incurable adhesive.

The guide film may include an incision line extending along a boundary between the fourth film portion and the main film portion, the incision line may include a plurality of incision patterns, and the plurality of incision patterns may penetrate the boundary between the fourth film portion and the main film portion in a thickness direction of the guide film.

A planar size of the first ultraviolet absorption pattern may be equal to a planar size of the fourth film portion.

The guide film may include a first coupling member disposed on first surfaces of the film portions; a release film attached to the first coupling member; and a second coupling member disposed between the first ultraviolet absorption pattern and the fourth film portion. The first coupling member may include an ultraviolet-curing adhesive, and the second coupling member may include an ultraviolet-incurable adhesive.

The stage may include a first stage; and a second stage which is disposed between the first stage and the shaping pad. The second stage may include long sides extending in a first direction; and short sides extending in the second direction, a side of the short sides of the second stage and the long sides of the second stage may be overlapped by the first stage, and another side of the short sides of the second stage may be exposed by the first stage.

According to the aforementioned and other embodiments of the disclosure, the movement of the bending area of a curved display panel can be prevented during the fabrication of a curved display device.

A guide film capable of preventing the movement of the bending area of a curved display panel during the fabrication of a curved display device can be provided.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which:

FIG. 2 is a schematic cross-sectional view taken along line I-I' of FIG. 1;

FIG. 3 is a schematic cross-sectional view taken along line II-II' of FIG. 1;

FIG. 14 is a schematic flowchart illustrating a method of fabricating a display device according to an embodiment of the disclosure;

FIG. 16 is a schematic plan view illustrating a fourth non-display area, a driving chip, and a printed circuit film of a display panel of FIG. 15;

DETAILED DESCRIPTION OF THE EMBODIMENTS

Figure 1:
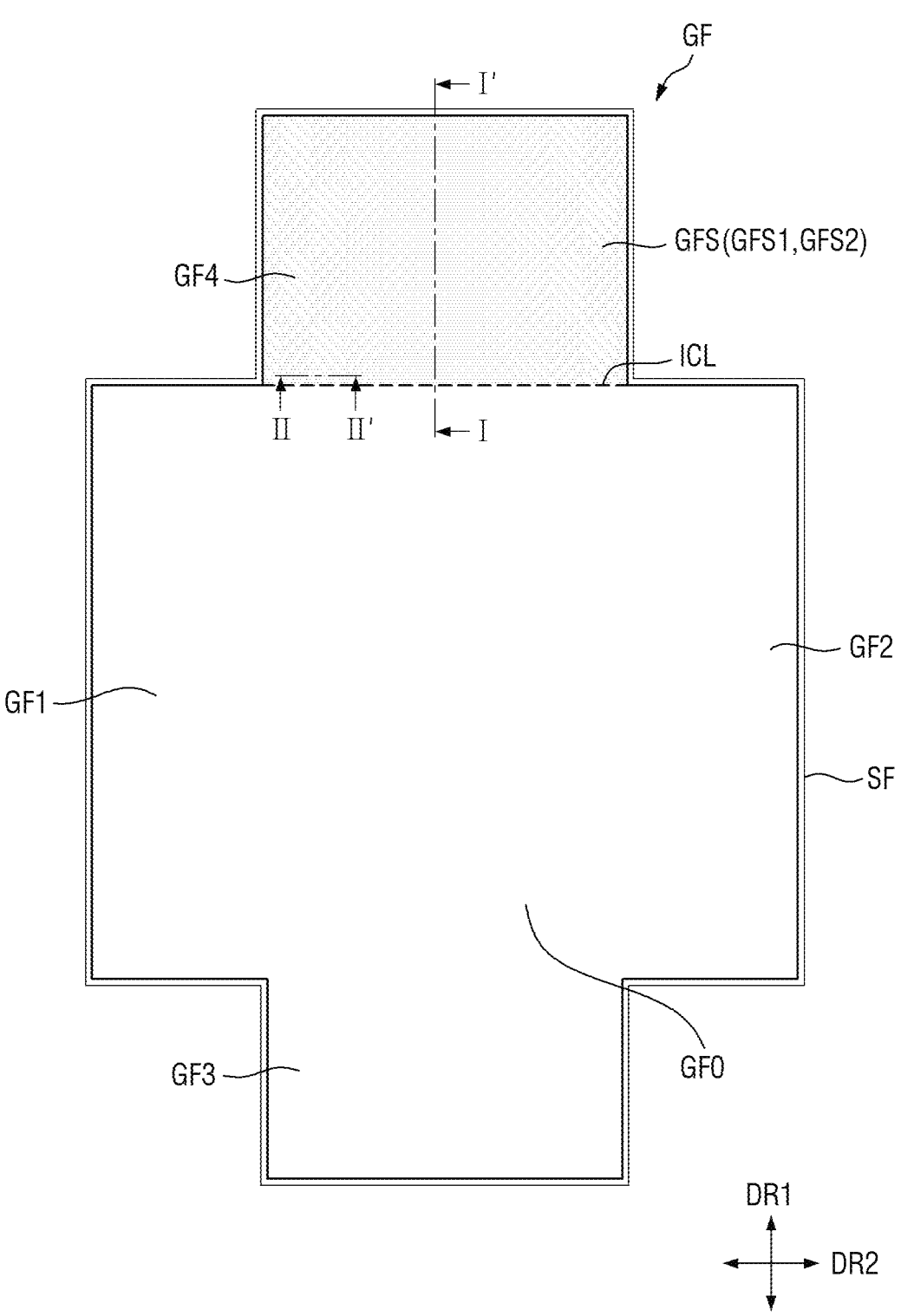
FIG. 1 is a schematic plan view of a guide film according to an embodiment of the disclosure.

Specific structural and functional descriptions of embodiments of the disclosure disclosed herein are only for illustrative purposes of the embodiments of the disclosure. The invention may be embodied in many different forms without departing from the spirit and significant characteristics of the disclosure. Therefore, the embodiments of the disclosure are disclosed only for illustrative purposes and should not be construed as limiting the disclosure.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled"

or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" or the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer," or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an idealized or overly formal sense unless clearly defined herein.

Some embodiments are described herein with reference to cross section illustrations that are schematic illustrations of the embodiments. As such, variations from the shapes of the illustrations as a result, for example, of manufacturing techniques and/or tolerances, are to be expected. Thus, embodiments described herein should not be construed as being limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the disclosure will be described with reference to the attached drawings.

Figure 4:
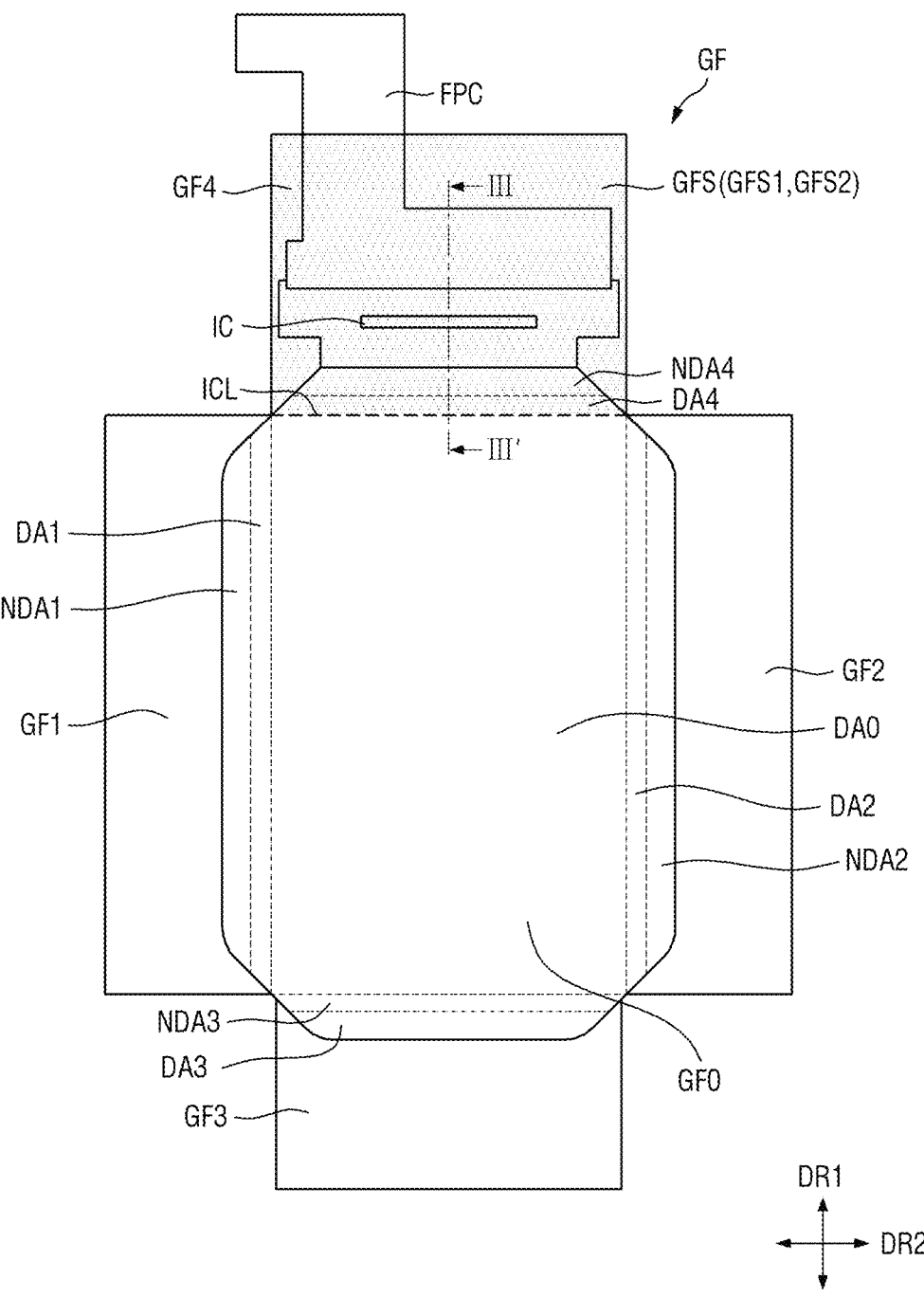
FIG. 4 is a schematic plan view of a display panel to which the guide film of FIG. 1 is applied.
Figure 5:
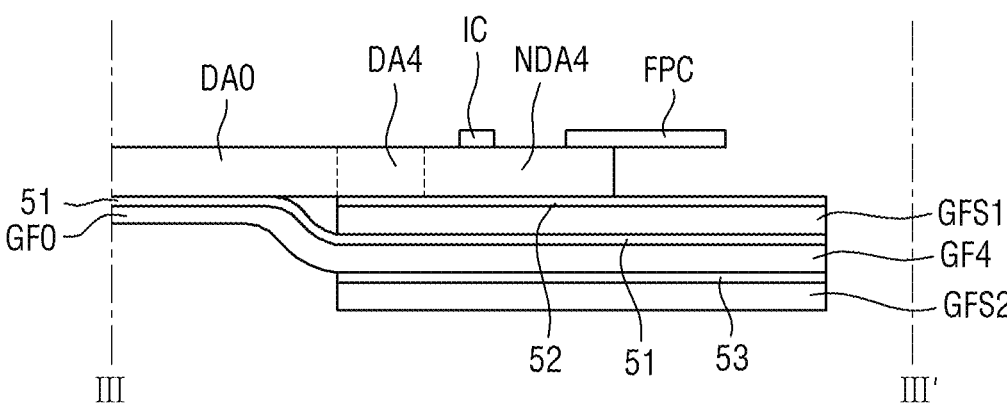
FIG. 5 is a schematic cross-sectional view taken along line III-III' of FIG. 4.

FIG. 1 is a schematic plan view of a guide film according to an embodiment of the disclosure. FIG. 2 is a schematic cross-sectional view taken along line I-I' of FIG. 1. FIG. 3 is a schematic cross-sectional view taken along line II-II' of FIG. 1. FIG. 4 is a schematic plan view of a display panel to which the guide film of FIG. 1 is applied. FIG. 5 is a schematic cross-sectional view taken along line III-III' of FIG. 4.

In the description that follows, first and second directions DR1 and DR2 refer to two different directions that intersect each other, for example, two directions that perpendicularly intersect each other in a plan view, and a third direction DR3 refers to a direction that intersects the plane where the first and second directions DR1 and DR2 lie, for example, a direction that perpendicularly intersects both the first and second directions DR1 and DR2. Referring to FIG. 1, a side or a first side in the first direction DR1 refers to an upward direction, the other side or a second side in the first direction DR1 refers to a downward direction, a side or a first side in the second direction DR1 refers to a rightward direction, and the other side or a second side in the second direction DR1 refers to a leftward direction. However, the directions set forth herein are simply relative directions, and the disclosure is not limited thereto.

Referring to FIGS. 1 through 5, a guide film GF may include film portions (GF0, GF1, GF2, GF3, and GF4), i.e., a main film portion GF0 and first, second, third, and fourth film portions GF1, GF2, GF3, and GF4, and ultraviolet (UV) absorption patterns GFS.

Referring to FIG. 1, the main film portion GF0 may be disposed at the center of the guide film GF.

The first film portion GF1 may be disposed on a second side of the main film portion GF0 in the second direction DR2, the second film portion GF2 may be disposed on a first side of the main film portion GF0 in the second direction DR2, the third film portion GF3 may be disposed on a first side of the main film portion GF0 in the first direction DR1, and the fourth film portion GF4 may be disposed on a second side of the main film portion GF0 in the first direction DR1.

The first film portion GF1 may protrude toward the second side of the main film portion GF0 in the second direction DR2, the second film portion GF2 may protrude toward the first side of the main film portion GF0 in the second direction DR2, the third film portion GF3 may protrude toward the second side of the main film portion GF0 in the first direction DR1, and the fourth film portion GF4 may protrude toward the first side of the main film portion GF0 in the first direction DR1.

The first, second, third, and fourth film portions GF1, GF2, GF3, and GF4 may be physically connected to the main film portion GF or may be integral with the main film portion GF0.

The UV absorption patterns GFS may be disposed to overlap the fourth film portion GF4. The UV absorption patterns GFS may be aligned with the boundary between the fourth film portion GF4 and the main film portion GF0. The UV absorption patterns GFS may include first and second UV absorption patterns GFS1 and GFS2. The UV absorption patterns GFS may include a film material and an UV absorption material scattered in the film material. The first and second UV absorption patterns GFS1 and GFS2 may include the same material.

The main film portion GF0, the first, second, third, and fourth film portions GF1, GF2, GF3, and GF4, and the UV absorption patterns GFS may have a tetragonal shape in a plan view. For example, in a plan view, the main film portion GF0 may have a rectangular shape having a pair of long sides extending in the first direction and a pair of short sides extending in the second direction DR2, and the first, second, third, and fourth film portions GF1, GF2, GF3, and GF4 and the UV absorption patterns GFS may have a square shape. However, the disclosure is not limited to this example. As another example, the main film portion GF0 may have a square shape, a circular or elliptical shape or a non-tetragonal polygonal shape in a plan view. The planar shape of the first, second, third, and fourth film portions GF1, GF2, GF3, and GF4 and the UV absorption patterns GFS is not particularly limited, and the first, second, third, and fourth film portions GF1, GF2, GF3, and GF4 and the UV absorption patterns GFS may have a rectangular shape, a circular or elliptical shape or a non-tetragonal polygonal shape in a plan view.

The planar size of the main film portion GF0 may be greater than the planar sizes of the first, second, third, and fourth film portions GF1, GF2, GF3, and GF4 and the UV absorption patterns GFS.

The planar size of the first film portion GF1 may be equal to, or different from, the planar size of the second film portion GF2.

The planar size of the third film portion GF3 may be equal to, or different from, the planar size of the fourth film portion GF4.

The planar size of the first UV absorption pattern GFS1 may be equal to the planar size of the second UV absorption pattern GFS2.

The planar size of the fourth film portion GF4 may be equal to the planar size of the UV absorption patterns GFS. In some embodiments, the planar size of the fourth film portion GF4 may be greater than the planar size of the UV absorption patterns GFS.

The guide film GF may further include a release film SF. The release film SF may cover or overlap and protect the entire guide film GF except for the fourth guide film portion GF4, i.e., the main film portion GF0 and the first, second, and third film portions GF1, GF2, and GF3.

An incision line ICL may be disposed along the boundary between the fourth film portion GF4 and the main film portion GF0 in the second direction DR2. The incision line ICL may include incision patterns.

Referring to FIG. 2, the first UV absorption pattern GFS1 may be disposed above the fourth film portion GF4 in a thickness direction, and the second UV absorption pattern GFS2 may be disposed below the fourth film portion GF4 in the thickness direction.

The release film SF may be disposed on first surfaces of the film portions (GF0, GF1, GF2, GF3, and GF4).

The guide film GF may further include first, second, and third coupling members 51, 52, and 53. The first coupling member 51 may be disposed on the first surfaces (or the top surfaces) of the film portions (GF0, GF1, GF2, GF3, and GF4). The first coupling member 51 may be interposed between the release film SR and the first surfaces (or the top surfaces) of all the film portions (GF0, GF1, GF2, GF3, and GF4) except for the fourth film portion GF4.

The second coupling member 52 may be interposed between the second UV absorption pattern GFS2 and a second surface (or the bottom surface) of the fourth film portion GF4.

The third coupling member 53 may be interposed between the first UV absorption pattern GFS1 and the release film SF.

Each of the first, second, and third coupling members 51, 52, and 53 may include an adhesive. The first coupling member 51 may include a UV-curable adhesive that can be cured by UV light.

On the contrary, each of the second and third coupling members 52 and 53 may include a UV-incurable adhesive that cannot be cured by UV light.

As another example, each of the second and third coupling members 52 and 53 may include an adhesive that reacts with UV light and is less UV-curable than the first coupling member 51.

The second and third coupling members 52 and 53 may be aligned with the boundary between the fourth film portion GF4 and the main film portion GF0.

Referring to FIG. 3, the incision line ICL may include incision patterns ICP. The incision patterns ICP may penetrate the boundary between the fourth film portion GF4 and the main film portion GF0 in the thickness direction.

Referring to FIG. 4, the guide film GF may generally cover or overlap a display panel 10. Examples of the display panel 10 include an organic light-emitting diode (OLED) display panel, a micro light-emitting diode (LED) display panel, a nano LED display panel, a quantum-dot LED display panel, a liquid crystal display (LCD) panel, a plasma display panel (PDP), a field emission display (FED) panel, an electrophoretic display panel (EPD), and an electrowetting display panel. The display panel 10 will hereinafter be described as being, for example, an OLED display panel.

In a plan view, the display panel 10 may have a rectangular shape with rounded corners. As another example, in a plan view, the display panel 10 may have a rectangular shape with right-angled corners, a square shape, a circular or elliptical shape, or a non-tetragonal polygonal shape. The display panel 10 will hereinafter be described as having, for example, a rectangular shape with rounded corners.

The display panel 10 may include a main area and edge areas, which are disposed around the main area. The main area of the display panel 10 may be located in the middle of the display panel 10, and the edge areas of the display panel 10 may be located along the edges of the main area. In the main area of the display panel 10, a main display area DA0, which displays an image, may be provided. To display an image, pixels are needed. Thus, pixels may be disposed in the main display area DA0.

The edge areas may be located along the edges of the main display area DA0.

A first edge area may be located on a second side of the main display area DA0 in the second direction DR2, a second edge area may be located on a first side of the main display area DA0 in the second direction DR2, a third edge area may be located on a second side of the main display area DA0 in the first direction DR1, and a fourth edge area may be located on a first side of the main display area DA0 in the first direction DR1. The edge areas may be connected to the main display area DA0 or may be integral with the main display area DA0.

Outer profiles of the first edge area may include a first profile which has a convex shape toward a first side in the first direction DR1, and a second side in the second direction DR2 of the guide film GF, a second profile which extends in the first direction DR1, and a third profile which is symmetrical with the first profile in the second direction DR2 and is adjacent to the third edge area. The first, second, and third profiles may be sequentially connected.

The outer profiles of the second edge area may be symmetrical with the outer profiles of the first edge area in the first direction DR1. The outer profiles of the third edge area may include a fourth profile which has a convex shape toward a second side in the first direction DR1, and the second side in the second direction DR2 of the guide film GF, a fifth profile which extends in the second direction DR2, and a sixth profile which is symmetrical with the fourth profile in the first direction DR1 and is adjacent to the second edge area.

The outer profiles of the fourth edge area may include a seventh profile which has a convex shape toward the first side in the first direction DR1, and the second side in the second direction DR2 of the guide film GF, an eighth profile which is connected to the seventh profile and extends along the first side in the first direction DR1 of the guide film GF, a ninth profile which is connected to the eighth profile and extends toward the second side in the second direction of the guide film GF, a tenth profile which is connected to the ninth profile and extends toward the first side in the first direction DR1 of the guide film GF, an eleventh profile which is connected to the tenth profile and extends toward the first side in the second direction of the guide film GF, a twelfth profile which is connected to the eleventh profile and is symmetrical with the tenth profile in the first direction DR1, a thirteenth profile which is connected to the twelfth profile and is symmetrical with the ninth profile in the first direction DR1, a fourteenth profile which is connected to the thirteenth profile and is symmetrical with the eighth profile in the first direction DR1 and a fifteenth profile which is connected to the fourteenth profile, is symmetrical with the seventh profile in the first direction DR1, and is adjacent to the second edge area.

Each of the edge areas may include a display area and a non-display area. Each of the display areas of the edge areas may display an image and may include pixels, and each of the non-display areas of the edge areas may not display an image and may not include pixels.

The first edge area may include a first display area DA1 and a first non-display area NDA1, the second edge area may include a second display area DA2 and a second non-display area NDA2, the third edge area may include a third display area DA3 and a third non-display area NDA3, and the fourth edge area may include a fourth display area DA4 and a fourth non-display area NDA4.

The first display area DA1 may be located between the first non-display area NDA1 and the main display area DA0, the second display area DA2 may be located between the second non-display area NDA2 and the main display area DA0, the third display area DA3 may be located between the third non-display area NDA3 and the main display area DA0, and the fourth display area DA4 may be located between the fourth non-display area NDA4 and the main display area DA0.

The fourth non-display area NDA4 may include a first sub-non-display area NDA41 (of FIG. 16) which adjoins the fourth display area DA4, a second sub-non-display area NDA42 (of FIG. 16) which is spaced apart from the fourth non-display area DA4 by the first sub-non-display area NDA41, and a third sub-non-display area NDA43 (of FIG. 16) which is spaced apart from the first sub-non-display area NDA41 by the second sub-non-display area NDA42.

The outer profiles of the first sub-non-display area NDA41 may include a section that extends from a location where the seventh profile meets the fourth display area DA4 to a location where the seventh profile meets the eighth profile and a section that extends from a location where the fifteenth profile meets the fourth display area DA4 to a location where the fifteenth profile meets the fourteenth profile.

The outer profiles of the second sub-non-display area NDA42 may include the eighth profile and the fourteenth profile.

The outer profiles of the third sub-non-display area NDA43 may include the ninth, tenth, eleventh, twelfth, and thirteenth profiles.

The first, second, and third sub-non-display areas NDA41, NDA42, and NDA43 may have different widths in the second direction DR2. For example, the width of the second sub-non-display area NDA42 in the second direction DR2 may be smaller than the widths of the first and third sub-non-display areas NDA41 and NDA43 in the second direction DR2.

A driving chip IC may be disposed in the third sub-non-display area NDA43. The driving chip IC may include a data integrated circuit (IC) and/or a sensing IC.

A printed circuit film FPC may be disposed at the end of the third sub-non-display area NDA43. The printed circuit film FPC may include a connector which is electrically connected to an external device. The printed circuit film FPC may transmit various driving signals applied thereto via the connector to the driving chip IC and/or the pixels of each of the display areas of the display panel 10.

The main film portion GF0 may correspond to the main display area DA0 of the display panel 10, and the first, second, third, and fourth film portions GF1, GF2, GF3, and GF4 may correspond to the first, second, third, and fourth edge areas of the display panel 10, respectively. The planar size of the main film portion GF0 may be equal to the planar size of the main display area DA0. The planar size of the first, second, third, and fourth film portions GF1, GF2, GF3, and GF4 may be greater than the planar size of the first, second, third, and fourth edge areas of the display panel 10. The first, second, third, and fourth film portions GF1, GF2, GF3, and GF4 may be aligned with the boundaries between the main display area DA0 and the first, second, third, and fourth edge areas, respectively. The fourth film portion GF4 may cover or overlap the fourth edge area and may cover or overlap parts of the driving chip IC and the printed circuit film FPC.

Referring to FIG. 5, the release film SF may be peeled off, and the main display area DA0 and the first, second, and third edge areas may be attached to the first coupling member 51. The fourth edge area which includes the fourth display area DA4 and the fourth non-display area NDA4, may be attached to the second coupling member 52. As illustrated in FIG. 5, the first coupling member 51 may not be attached, in part, to the main display area DA0 which is adjacent to the fourth edge area due to the presence of the first UV absorption pattern GFS1 and the difference in height with the second coupling member 52, and an empty space may be formed between part of the first coupling member 51 that is not attached to the main display area DA0 near the fourth edge area, the main display area DA0, the inner side surface of the second coupling member 52, and the inner side surface of the first UV absorption pattern GFS1.

The first coupling member 51 may include a UV-curable adhesive that can be cured by UV light. Thus, if UV light is applied during a peeling off of the entire guide film GF except for the fourth film portion GF4, the first coupling member 51 may be cured by the UV light. Before the process of the peeling off of the entire guide film GF except for the fourth film portion GF4, a lamination process may be performed between a curved window and a curved display panel via a panel window coupling member. The panel window coupling member may include a UV-curable adhesive.

After the lamination process, a process of the UV-curing of the panel window coupling member may be performed, and the first coupling member 51 may also be cured during the process of the UV-curing of the panel window coupling member. For example, the first coupling member 51 may be cured not only by UV light from the process of the UV-curing the panel window coupling member, but also by UV light from the process of the peeling off of the entire guide film GF except for the fourth film portion GF4, and as a result, the adhesion between the curved display panel and the entire guide film GF except for the fourth film portion GF4 may decrease, and the peeling off of the rest of the guide film GF can be facilitated. Since the incision line ICL is formed along the boundary between the fourth film portion GF4 and the main film portion GF0, the peeling off of the guide film GF can be further facilitated.

Since the second and third coupling members 52 and 53 include a UV-incurable adhesive, the second and third coupling members 52 and 53 may not be cured at all, or may be cured only slightly, by UV light during the process of the UV-curing of the panel window coupling member and during the process of the peeling off of the entire guide film GF except for the fourth film portion GF4. Since the UV absorption patterns GFS include a UV absorbing material, the UV absorption patterns GFS can prevent UV light from arriving between the fourth film portion GF4 and the first UV absorption pattern GFS1.

Accordingly, even if UV light is applied until the removal of the UV absorption patterns GFS and the fourth film portion GF4, the first UV absorption pattern GFS1 may remain attached to the curved display panel, and the fourth film portion GF4 may remain attached to the first and second UV absorption patterns GFS1 and GFS2.

Guide films according to other embodiments of the disclosure will hereinafter be described. In the aforementioned and following embodiments, like elements indicate like elements, and thus, descriptions thereof will be omitted or simplified.

Figure 6:
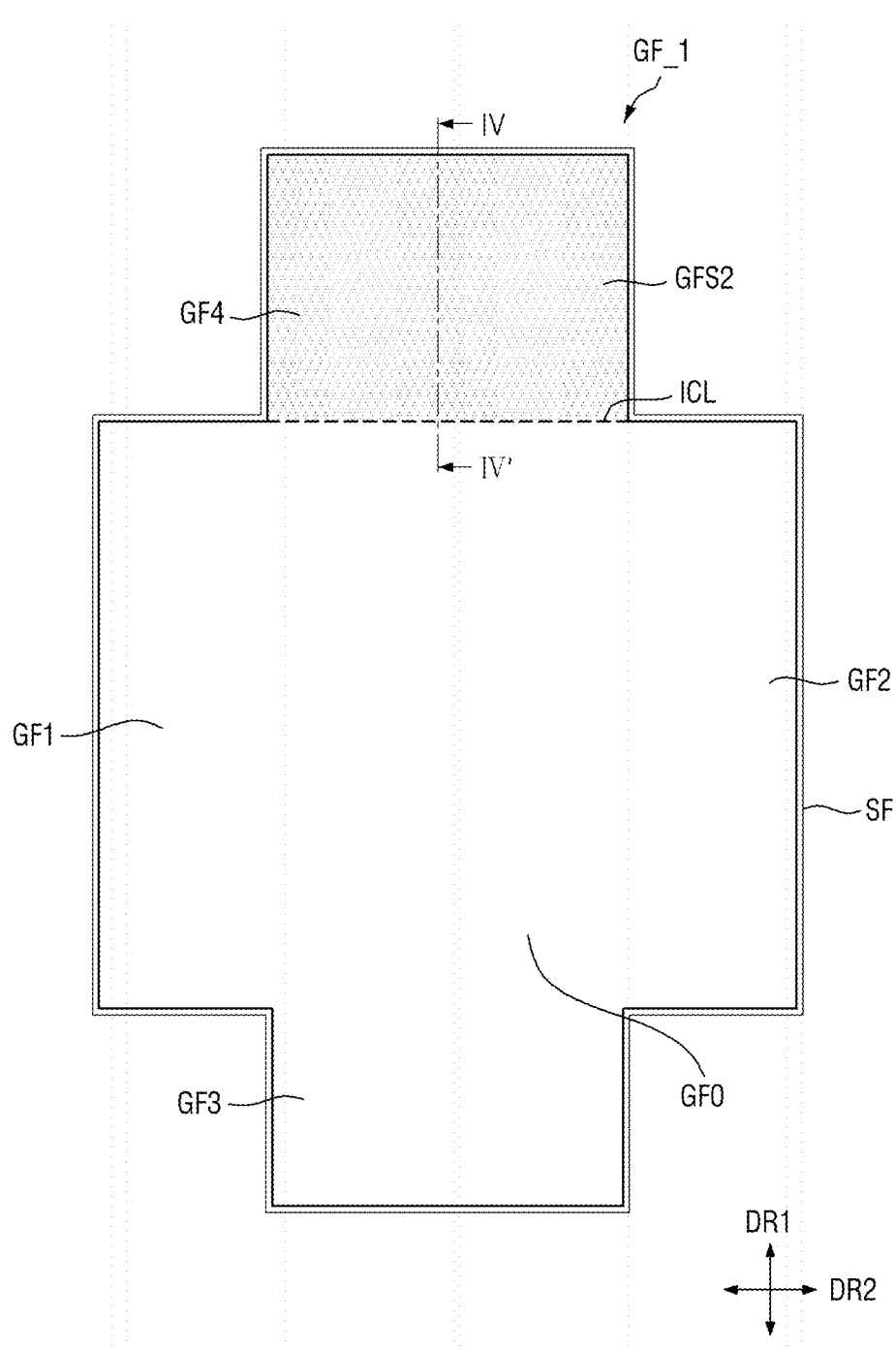
FIG. 6 is a schematic plan view of a guide film according to another embodiment of the disclosure.
Figure 7:
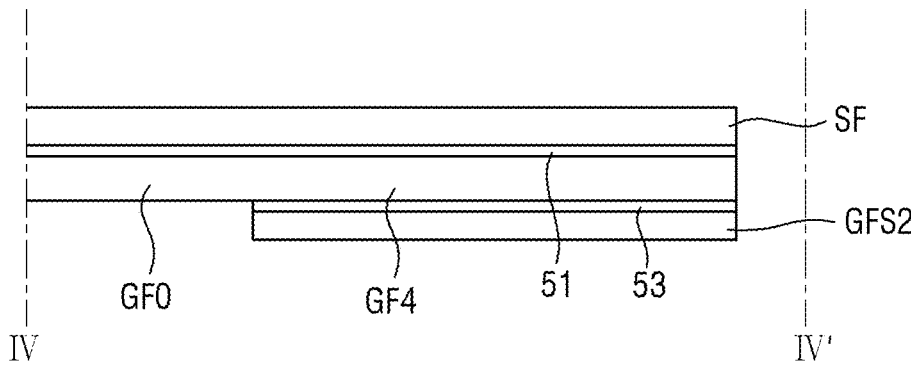
FIG. 7 is a schematic cross-sectional view taken along line IV-IV' of FIG. 6.

FIG. 6 is a schematic plan view of a guide film according to another embodiment of the disclosure. FIG. 7 is a schematic cross-sectional view taken along line IV-IV' of FIG. 6.

Referring to FIGS. 6 and 7, a guide film GF_1 may differ from the guide film GF of FIGS. 1 and 2 at least in that it does not include a first UV absorption pattern GFS1. Specifically, the guide film GF_1 may not include a first UV absorption pattern GFS1.

A second coupling member 52 may not be provided, and a release film SF may be in direct contact with first surfaces of film portions (GF0, GF1, GF2, GF3, and GF4).

The guide film GF_1 may be used in case that a process of the UV-curing of a panel window coupling member that follows a process of laminating a curved display panel and a curved window with the panel window coupling member is omitted.

Figure 8:
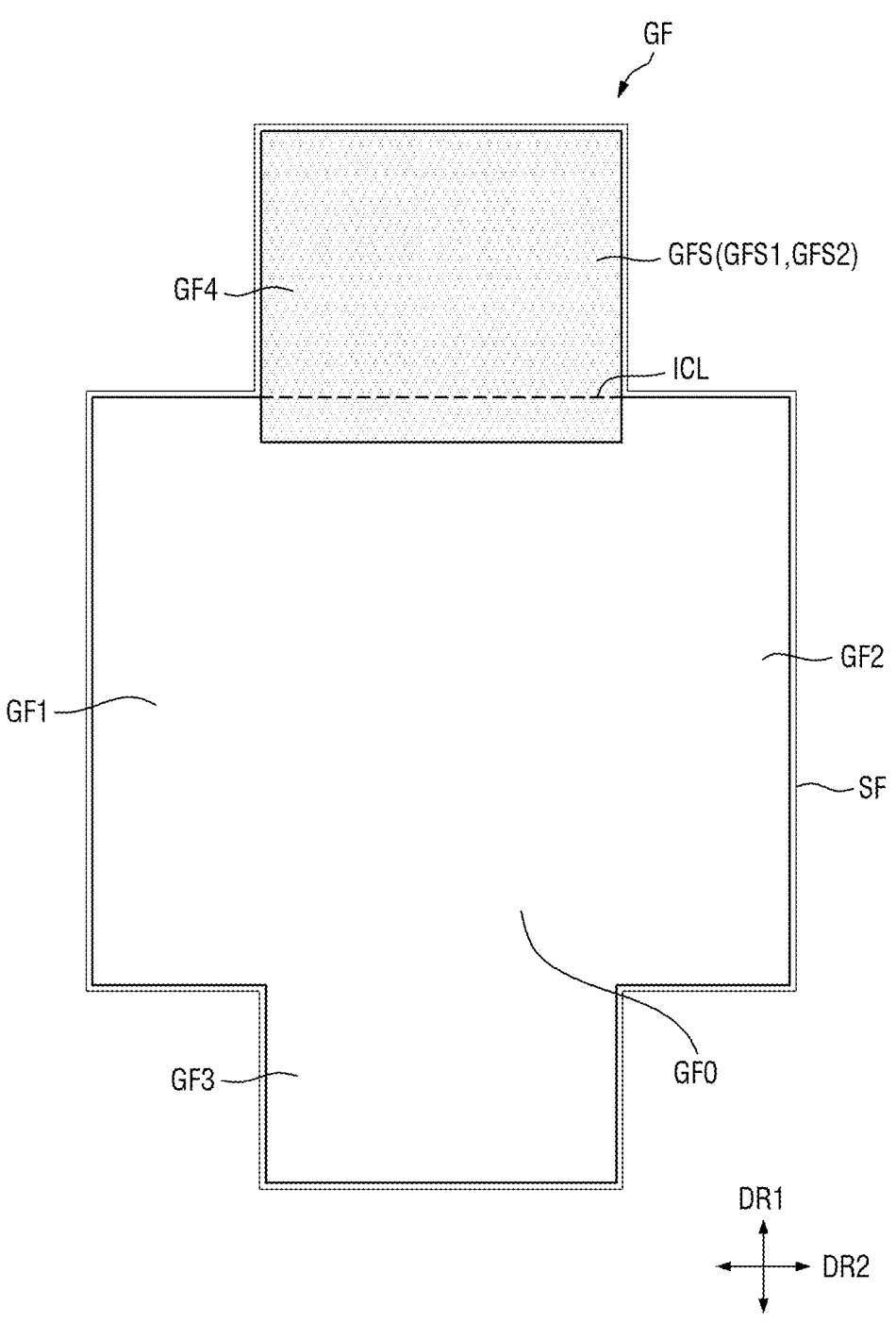
FIG. 8 is a schematic plan view of a guide film according to another embodiment of the disclosure.
Figure 9:
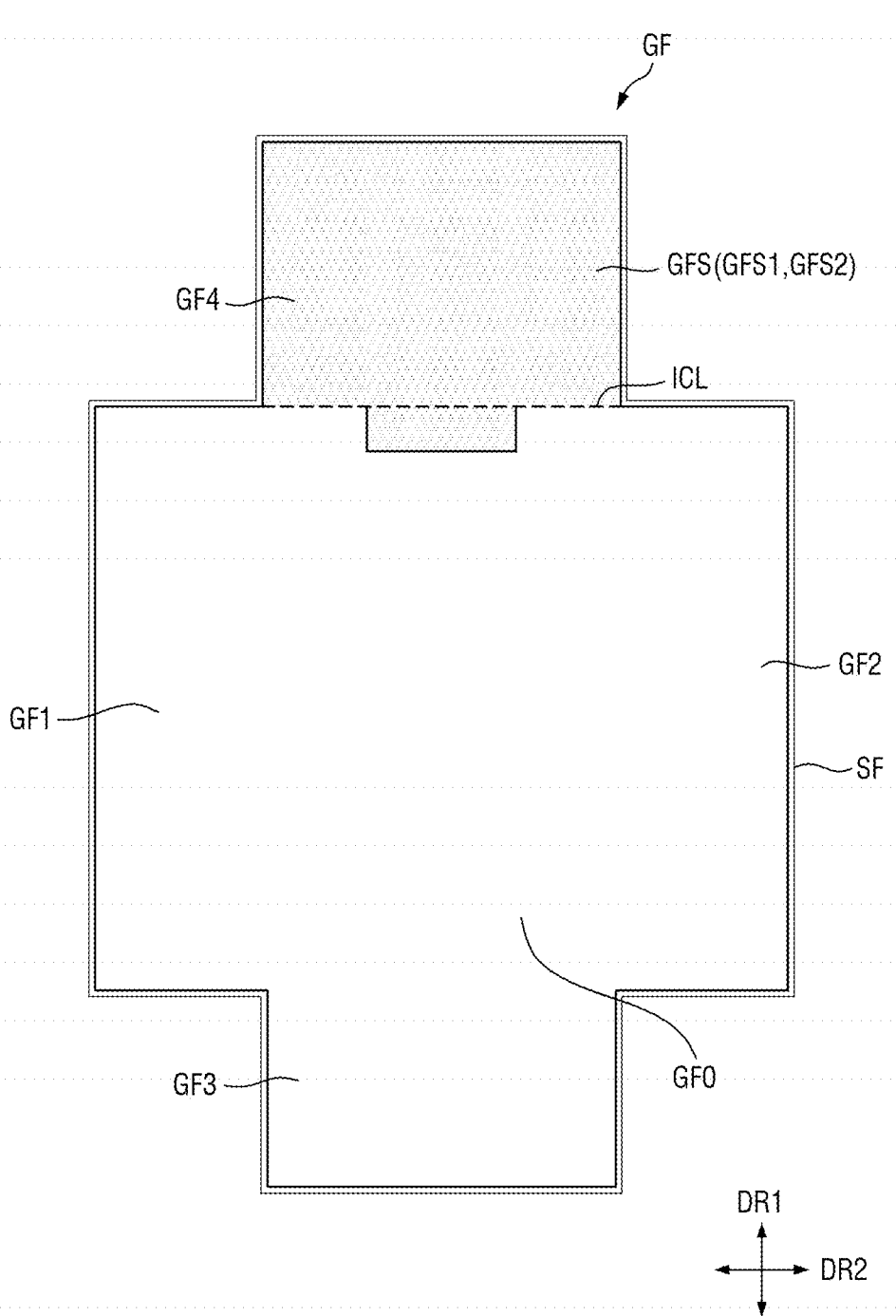
FIG. 9 is a schematic plan view of a guide film according to another embodiment of the disclosure.
Figure 10:
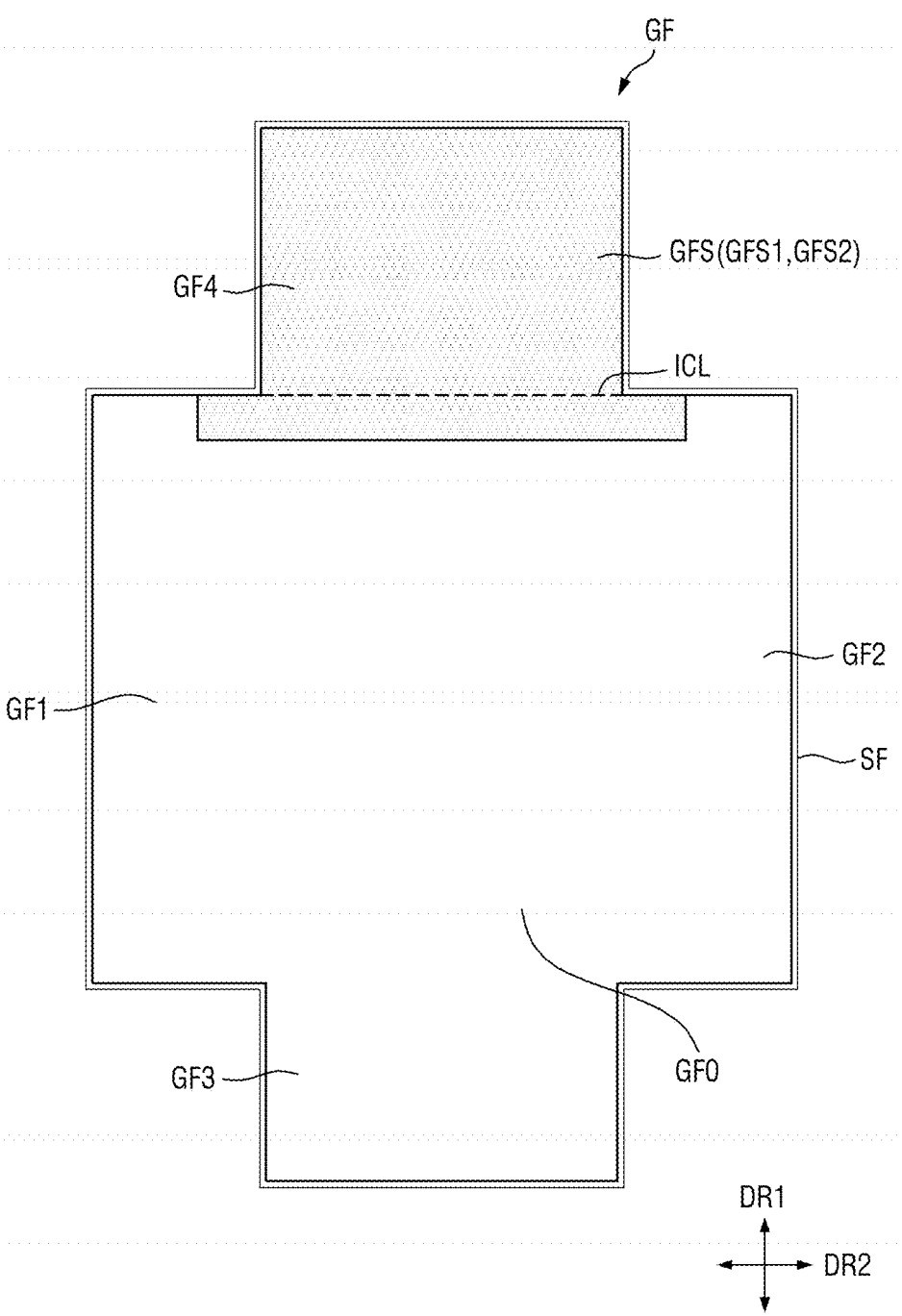
FIG. 10 is a schematic plan view of a guide film according to another embodiment of the disclosure.
Figure 11:
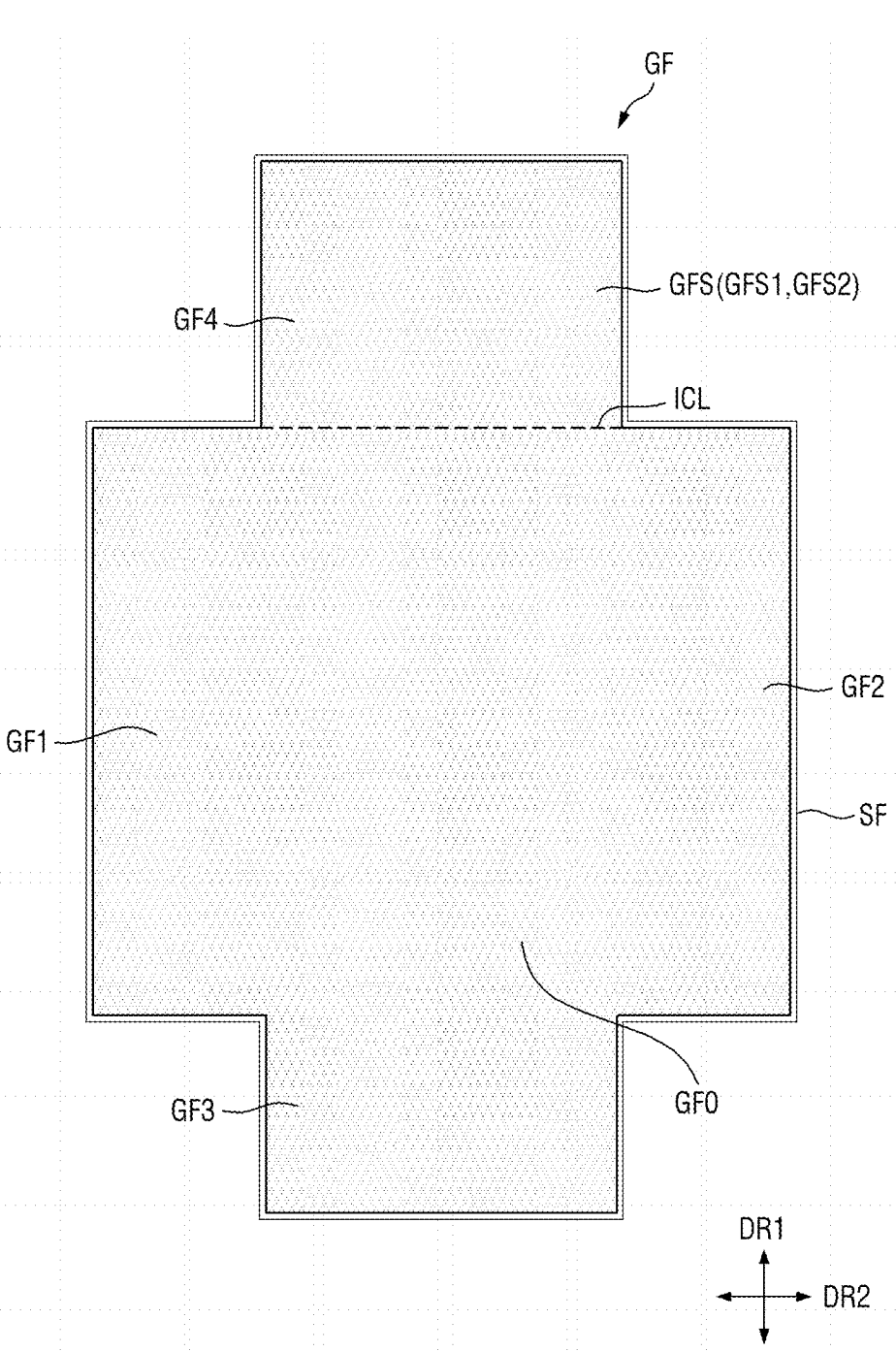
FIG. 11 is a schematic plan view of a guide film according to another embodiment of the disclosure.

FIG. 8 is a schematic plan view of a guide film according to another embodiment of the disclosure. FIG. 9 is a schematic plan view of a guide film according to another embodiment of the disclosure. FIG. 10 is a schematic plan view of a guide film according to another embodiment of the disclosure. FIG. 11 is a plan view of a guide film according to another embodiment of the disclosure.

FIGS. 8 through 11 show that the planar size of a guide film GF may vary. Referring to FIGS. 8 through 11, the guide film GF may have a larger size than a fourth film portion GF4 in a plan view.

Referring to FIG. 8, UV absorption patterns GFS may be disposed to overlap a main film portion GF0. The UV absorption patterns GFS may protrude beyond the fourth film portion GF4 toward the main film portion GF0 in a plan view. As illustrated in FIG. 8, the width of parts of the UV absorption patterns GFS that protrude beyond the fourth film portion GF4 to the main film portion GF0 in a second direction DR2 in a plan view may be equal to the width of the fourth film GF4 in the second direction DR2.

The UV absorption patterns GFS may be disposed not to overlap first, second, and third film portions GF1, GF2, and GF3.

Referring to FIG. 9, the width of the parts of the UV absorption patterns GFS that protrude beyond the fourth film portion GF4 to the main film portion GF0 in the second direction DR2 in a plan view may be smaller than the width of the fourth film GF4 in the second direction DR2.

Referring to FIG. 10, the width of the parts of the UV absorption patterns GFS that protrude beyond the fourth film portion GF4 to the main film portion GF0 in the second direction DR2 in a plan view may be greater than the width of the fourth film GF4 in the second direction DR2. The UV absorption patterns GFS may be disposed to overlap parts of the first and second film portions GF1 and GF2.

Referring to FIG. 11, the planar size of the UV absorption patterns GFS may be equal to the planar size of the entire guide film GF.

Other aspects and features of the embodiments of FIGS. 8 through 11 are substantially identical to their respective counterparts of the embodiment of FIGS. 1 through 3, and thus, detailed descriptions thereof will be omitted.

Figure 12:
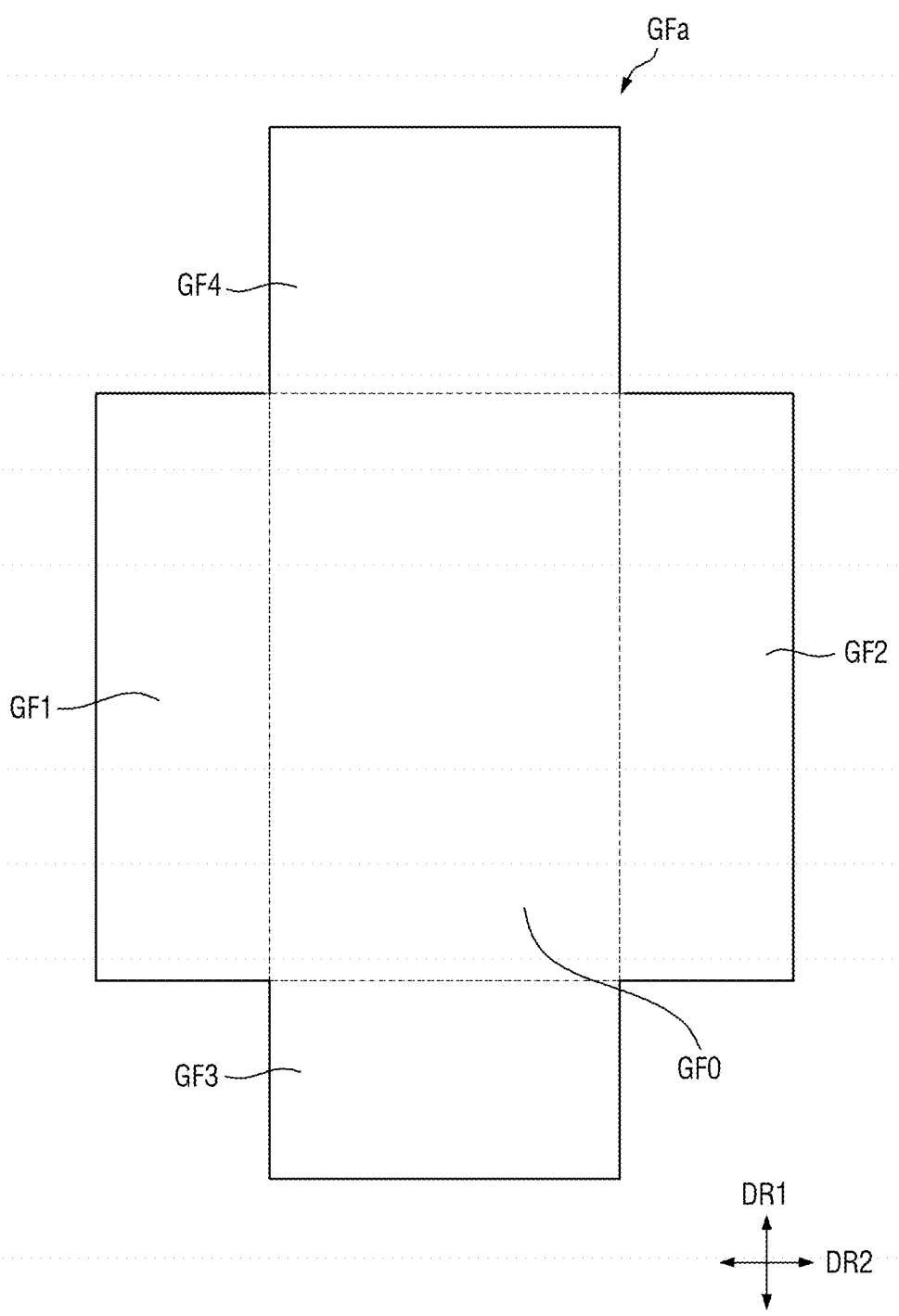
FIGS. 12 and 13 are schematic plan views illustrating a method of fabricating a guide film according to an embodiment of the disclosure.
Figure 13:
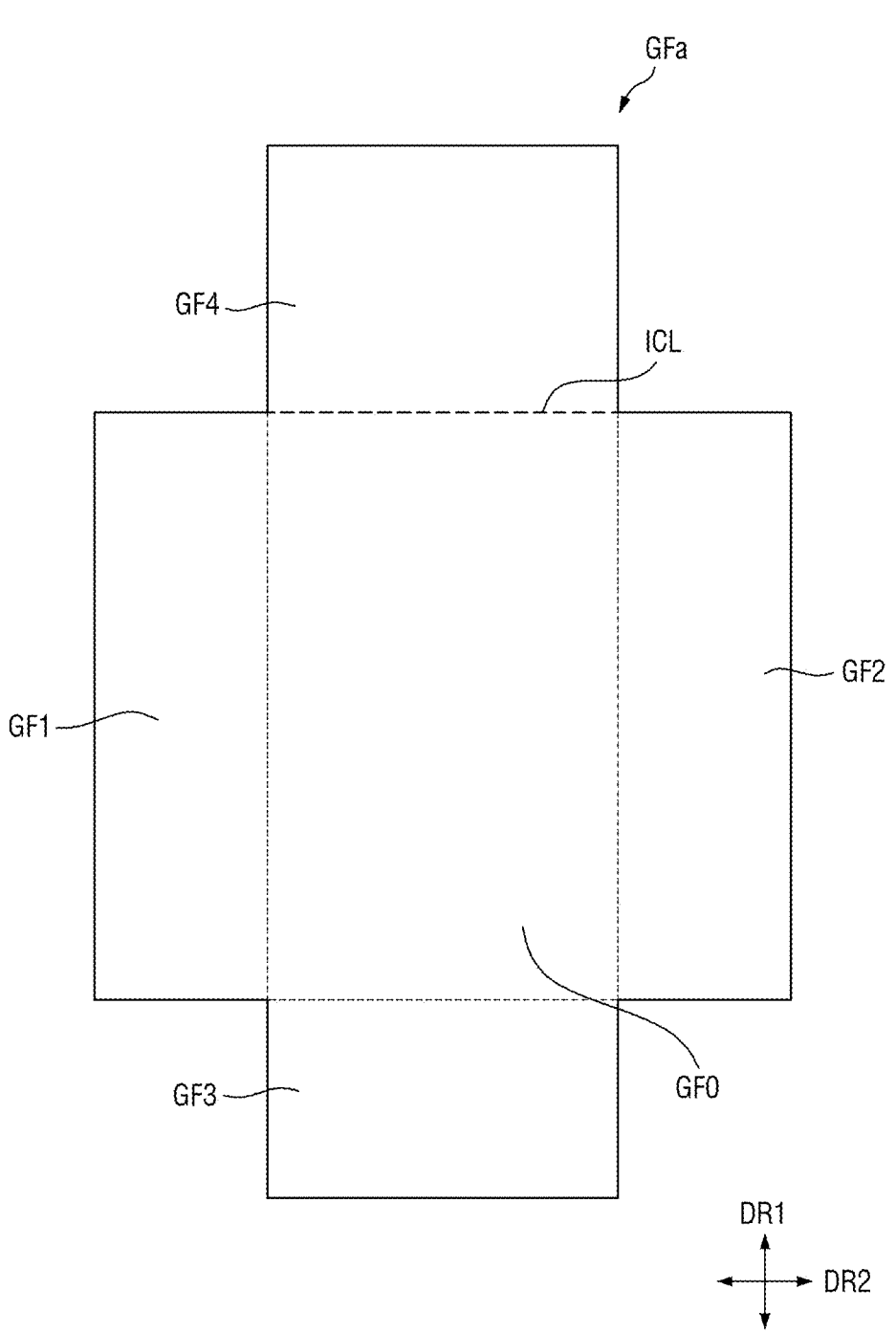

FIGS. 12 and 13 are schematic plan views illustrating a method of fabricating a guide film according to an embodiment of the disclosure.

Referring to FIG. 12, a guide film GFa is prepared. The guide film GFa may include film portions (GF0, GF1, GF2, GF3, and GF4), which may be identical to their respective counterparts of FIGS. 1 through 3.

Thereafter, an incision line ICL may be formed along the boundary between a main film portion GF0 and a fourth film portion GF4. The incision line ICL is as already described above with reference to FIGS. 1 through 3, and thus, a detailed description thereof will be omitted.

Thereafter, referring to FIGS. 1 and 2, a first coupling member 51 is disposed on a first surface (or the top surface) of the fourth film portion GF4. Thereafter, a first UV absorption pattern GFS1 may be formed to overlap the fourth film portion GF4 in a thickness direction of the guide film GF via the first coupling member 51, and a second UV absorption pattern GFS2 may be formed on a second surface (or the bottom surface) of the fourth film portion GF4. The second UV absorption pattern GFS2 may be attached to the second surface (or the bottom surface) of the fourth film portion GF4 via a third coupling member 53. A second coupling member 52 may be formed on a second surface of the first UV absorption pattern GFS1 that is opposite to the first surface of the first UV absorption pattern GFS1 that is attached to the first coupling member 51. A release film SF may be disposed on the first and second coupling members 51 and 52, exposed by the first UV absorption pattern GFS1.

A method of fabricating a display device according to an embodiment of the disclosure will hereinafter be described. In the aforementioned and following embodiments, like elements indicate like elements, and thus, descriptions thereof will be omitted or simplified.

The method of fabricating a display device may include curving a display panel with the use of (or by using) a guide film GF, laminating the curved display panel on a curved window, and attaching a panel bottom sheet onto a second surface of the curved display panel that is opposite to a first surface of the curved display panel on which the curved window is laminated. Part of the guide film GF may not be removed to prevent the bending part of the curved display panel from being untimely bent during the fabrication of the display device, and this will hereinafter be described.

FIG. 14 is a schematic flowchart illustrating a method of fabricating a display device according to an embodiment of the disclosure. FIGS. 15, 17, and 19 through 27 are schematic perspective views illustrating the method of FIG. 14. FIG. 16 is a schematic plan view illustrating a fourth non-display area, a driving chip, and a printed circuit film of a display panel of FIG. 15. FIG. 18 is a schematic cross-sectional view of the structure illustrated in FIG. 17.

Figure 15:
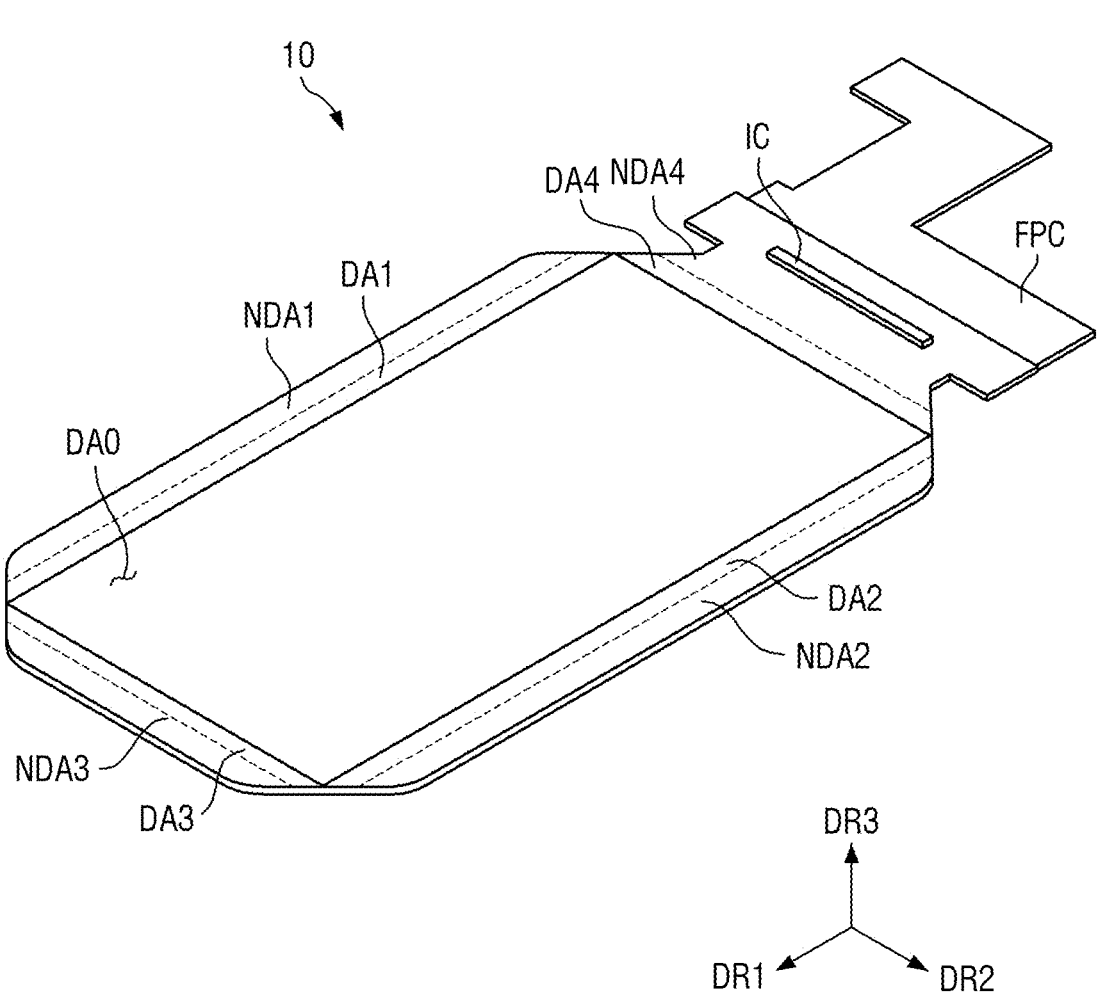
FIGS. 15, 17, and 19 through 27 are schematic perspective views illustrating the method of FIG. 14.

Referring to FIGS. 14 through 16, a display panel 10 including a main display area DA0, first, second, third, and fourth edge areas which are disposed around the main display area DA0, a driving chip IC which is disposed in a first pad area PA1 of the fourth edge area, and a printed circuit film FPC which is attached to a second pad area PA2 of the fourth edge area, is prepared (step S10). The first and second pad areas PA1 and PA2 may be located in a third sub-non-display area NDA43. As will be described below, a second sub-non-display area NDA42 may be bent in a thickness direction of the guide film GF. As the second sub-non-display area NDA2 is bent, a first sub-non-display area NDA41 and the third sub-non-display area NDA43 may be disposed to overlap each other in the thickness direction of the guide film GF. The display panel 10 is as already described above with reference to FIGS. 4 and 5, and thus, a detailed description thereof will be omitted.

Figure 17:
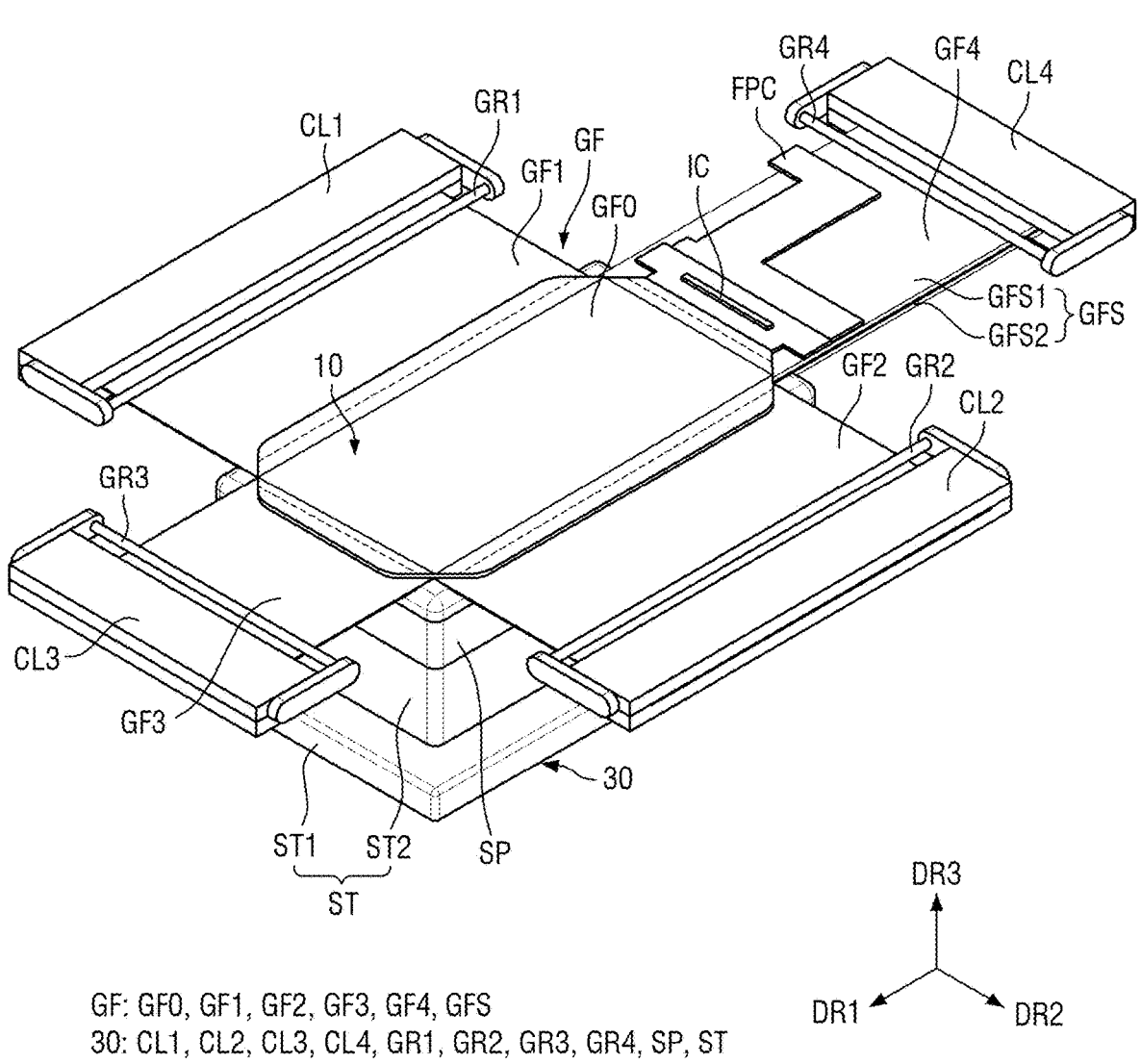
Figure 18:
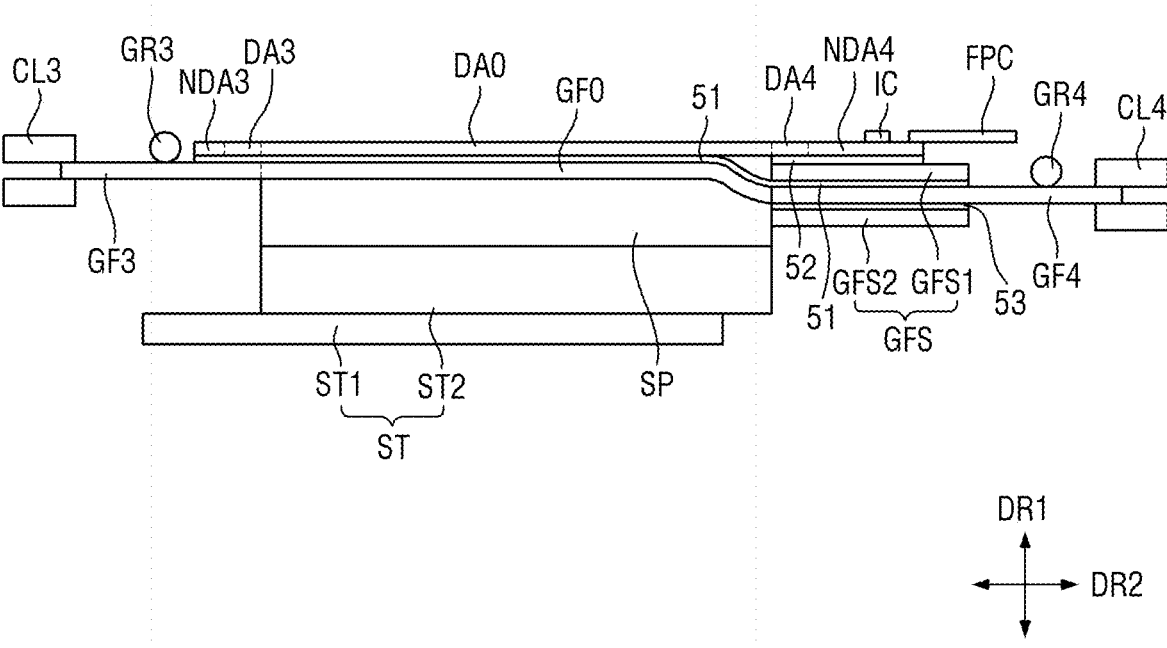
FIG. 18 is a schematic cross-sectional view of the structure illustrated in FIG. 17.

Thereafter, referring to FIGS. 14, 17, and 18, a guide film GF is placed on a supporting device 30, and the display panel 10 is placed on the guide film GF on the supporting device 30 (step S20).

The supporting device 30 may include first, second, third, and fourth clamps CL1, CL2, CL3, and CL4, first, second, third, and fourth guide rollers GR1, GR2, GR3, and GR4 which are connected to the first, second, third, and fourth clamps CL1, CL2, CL3, and CL4, respectively, a stages which is disposed below the guide film GF, and a shaping pad SP.

The supporting device 30 and the guide film GF may be parts of an apparatus for fabricating a display device which is used in the method of fabricating a display device. In other words, the apparatus for fabricating a display device may include the supporting device 30 and the guide film GF.

The stages ST may include a first stage ST1 which is the lowermost stage ST, and a second stage ST2 which is disposed above the first stage ST1. The shaping pad SP may be disposed above the second stage ST2. The shaping pad SP and the second stage ST2 may have a rectangular shape in a plan view. The planar size of the shaping pad SP may be substantially equal to the planar size of the second stage ST2. Each of the shaping pad SP and the second stage ST2 may include a pair of long sides extending in a first direction DR1 and a pair of short sides extending in a second direction DR2. Second short sides of the shaping pad SP and the second stage ST2 in the first direction DR1 may be covered or overlapped by the first stage ST1, but first short sides of the shaping pad SP and the second stage ST2 in the first direction DR1 may not be covered or overlapped by the first stage ST1 and may be exposed. In case that the display panel 10 is curved, the printed circuit film FPC which is attached to the fourth edge area of the display panel 10 may extends toward a second side of the display panel 10 in a third direction DR3. However, since the first short sides of the shaping pad SP and the second stage ST2 are not overlapped by the first stage ST1 and are exposed, interference between the printed circuit film FPC and the first stage ST1 can be prevented in case that the printed circuit film FPC extends toward the second side of the display panel 10 in the third direction DR3.

The shaping pad SP may include a flexible material. The shaping pad SP may include, for example, a rubber or fluid material.

A main film portion GF0 of the guide film GF may be disposed to overlap the shaping pad in the thickness direction of the guide film GF. The main film portion GF0 may be disposed to completely overlap the shaping pad SP, and first, second, third, and fourth film portions GF1, GF2, GF3, and GF4 of the guide film GF may be disposed not to overlap the shaping pad SP in the thickness direction of the guide film GF.

The first, second, third, and fourth film portions GF1, GF2, GF3, and GF4 may be fixed by the first, second, third, and fourth clamps CL1, CL2, CL3, and CL4, respectively. The first, second, third, and fourth clamps CL1, CL2, CL3, and CL4 may be disposed on first surfaces (or the top surfaces) and second surfaces (or the bottom surfaces) of end portions of the first, second, third, and fourth film portions GF1, GF2, GF3, and GF4, respectively, and may thus fix the first, second, third, and fourth film portions GF1, GF2, GF3, and GF4, respectively.

The first and second clamps CL1 and CL2 may extend in the first direction DR1, and the third and fourth clamps CL3 and CL4 may extend in the second direction DR2.

The first clamp CL1 may stretch (or apply a tensile force to) the first film portion GF1 toward the second side of the guide film GF in the second direction DR2 while fixing the first film portion GF1 from both first and second surfaces of the first film portion GF1, the second clamp CL2 may stretch the second film portion GF2 toward the first side of the guide film GF in the second direction DR2 while fixing the second film portion GF2 from both first and second surfaces of the second film portion GF2, the third clamp CL3 may stretch the third film portion GF3 toward the second side of the guide film GF in the first direction DR1 while fixing the third film portion GF3 from both first and second surfaces of the third film portion GF3, and the fourth clamp CL4 may stretch the fourth film portion GF4 toward the first side of the guide film GF in the first direction DR1 while fixing the fourth film portion GF4 from both first and second surfaces of the fourth film portion GF4.

The first, second, third, and fourth guide rollers GR1, GR2, GR3, and GR4 may be connected to the first, second, third, and fourth clamps CL1, CL2, CL3, and CL4, respectively. The first guide roller GR1 may be connected to the first clamp CL1 and may be disposed on the first surface (or the top surface) of the first film portion GF1. The first guide roller GR1 may be disposed between the first clamp CL1 and the main film portion GF0. The first guide roller GR1 may extend in the first direction DR1. The second guide roller GR2 may be connected to the second clamp CU and may be disposed on the first surface (or the top surface) of the second film portion GF2. The second guide roller GR2 may be disposed between the second clamp CL2 and the main film portion GF0. The second guide roller GR2 may extend in the first direction DR1. The third guide roller GR3 may be connected to the third clamp CL3 and may be disposed on the first surface (or the top surface) of the third film portion GF3. The third guide roller GR3 may be disposed between the third clamp CL3 and the main film portion GF0. The third guide roller GR3 may extend in the second direction DR2. The fourth guide roller GR4 may be connected to the fourth clamp CL4 and may be disposed on the first surface (or the top surface) of the fourth film portion GF4. The fourth guide roller GR4 may be disposed on a first surface (or the top surface) of a first UV absorption pattern GFS1. The fourth guide roller GR4 may be disposed between the fourth clamp CL1 and the main film portion GF0. The fourth guide roller GR4 may extend in the second direction DR2.

The display panel 10 may be disposed on the guide film GF. The main film portion GF0 may be disposed to correspond to a main display area DA0 of the display panel 10, and the first, second, third, and fourth film portions GF1, GF2, GF3, and GF4 may be disposed to correspond to the first, second, third, and fourth edge areas of the display panel 10, respectively. The planar size of the main film portion GF0 may be equal to the planar size of the main display area DA0. The planar size of the first, second, third, and fourth film portions GF1, GF2, GF3, and GF4 may be greater than the planar size of the first, second, third, and fourth edge areas of the display panel 10, respectively. The first, second, third, and fourth film portions GF1, GF2, GF3, and GF4 may be aligned with the boundaries between the main display area DA0 and the first, second, third, and fourth edge areas of the display panel 10, respectively. The fourth film portion GF4 may cover or overlap the fourth edge area and may overlap parts of a driving chip IC and a printed circuit film FPC which are disposed in the fourth edge area.

The main display area DA0 and the first, second, and third edge areas may be attached to a first coupling member 51. The fourth edge area which includes a fourth display area DA4 and a fourth non-display area NDA4 may be attached to a second coupling member 52.

Figure 19:
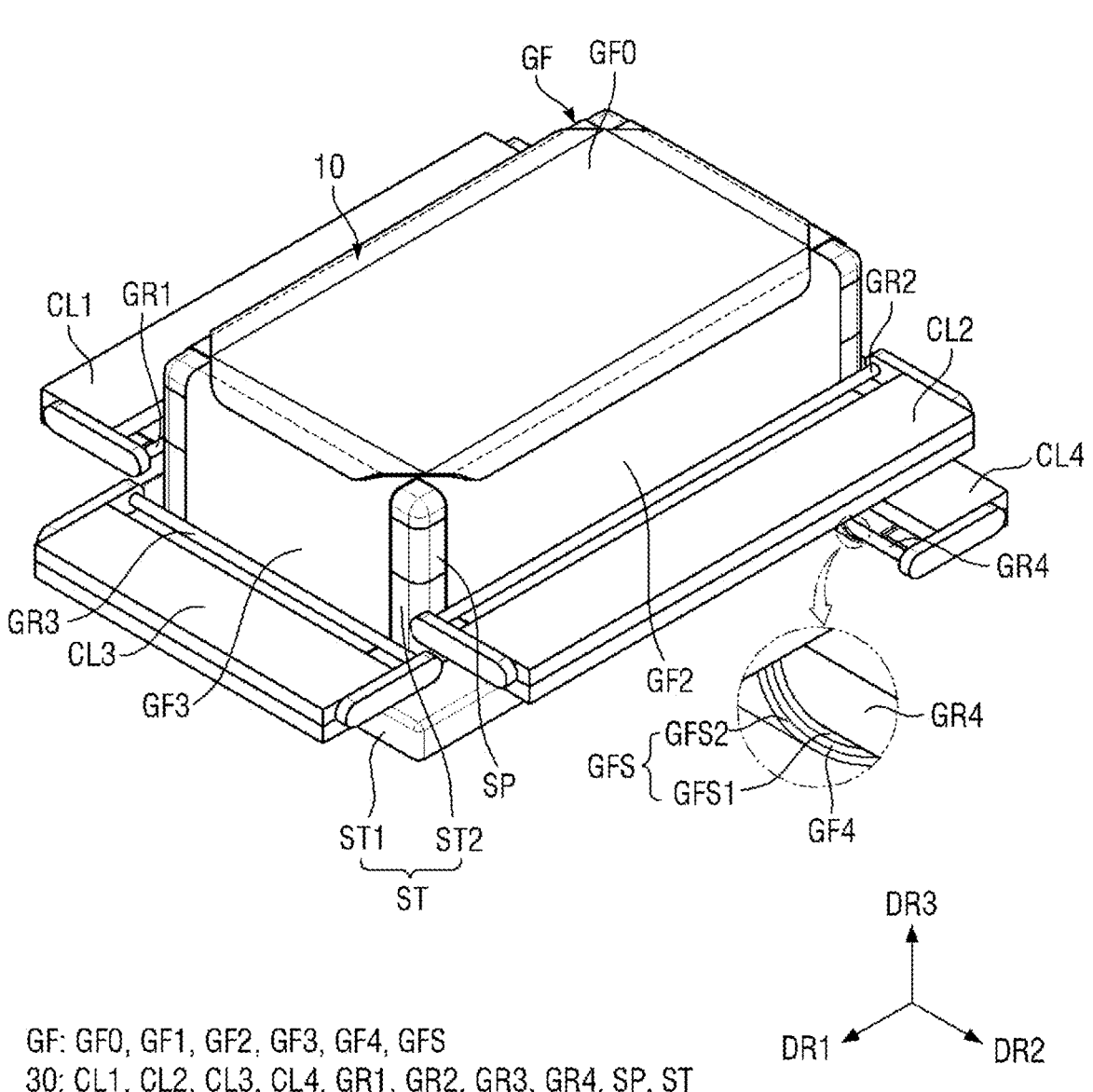

Thereafter, referring to FIGS. 14 and 19, the display panel 10 may be curved, thereby obtaining a curved display panel 10 (step S30).

Step S30 may be performed using the guide film GF. Specifically, the curved display panel 10 may be formed by lowering the first, second, third, and fourth film portions GF1, GF2, GF3, and GF4 with the first, second, third, and fourth guide rollers GR1, GR2, GR3, and GR4, which are connected to the first, second, third, and fourth clamps CL1, CL2, CL3, and CL4, respectively, and bending the first, second, third, and fourth edge areas of the display panel 10 from the main display area DA0. The areas of the first, second, third, and fourth film portions GF1, GF2, GF3, and GF4 that extend from the main film portion GF0 to the first, second, third, and fourth guide rollers GR1, GR2, GR3, and GR4 may extend in the third direction DR3 (or the thickness direction of the guide film GF), and the areas of the first, second, third, and fourth film portions GF1, GF2, GF3, and GF4 that extend from the first, second, third, and fourth guide rollers GR1, GR2, GR3, and GR4 to the ends (or a part of) of the first, second, third, and fourth film portions GF1, GF2, GF3, and GF4 fixed by the first, second, third, and fourth clamps CL1, CL2, CL3, and CL4 may extend in the second direction DR2 or the first direction DR1.

According to the method of FIG. 14, the first, second, third, and fourth edge areas of the display panel 10 may be deformed in advance before the lamination of the display panel 10 onto a curved window 50. Thus, the first, second, third, and fourth edge areas of the display panel 10 that extend in a horizontal direction (i.e., the first or second direction DR1 or DR2) can be prevented from being placed in contact with, and thereby physically damaged by, the curved window 50.

Figure 20:
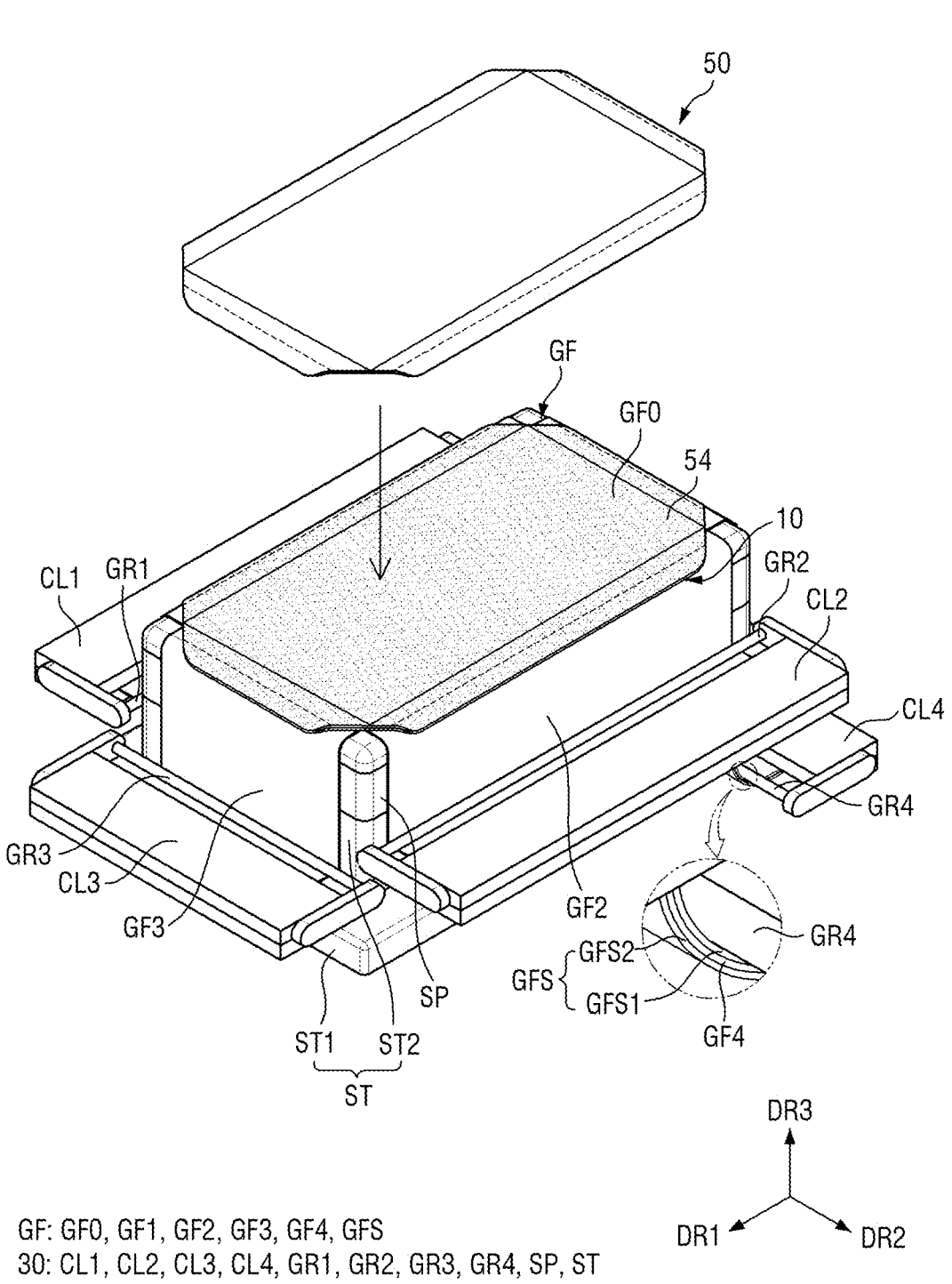
Figure 21:
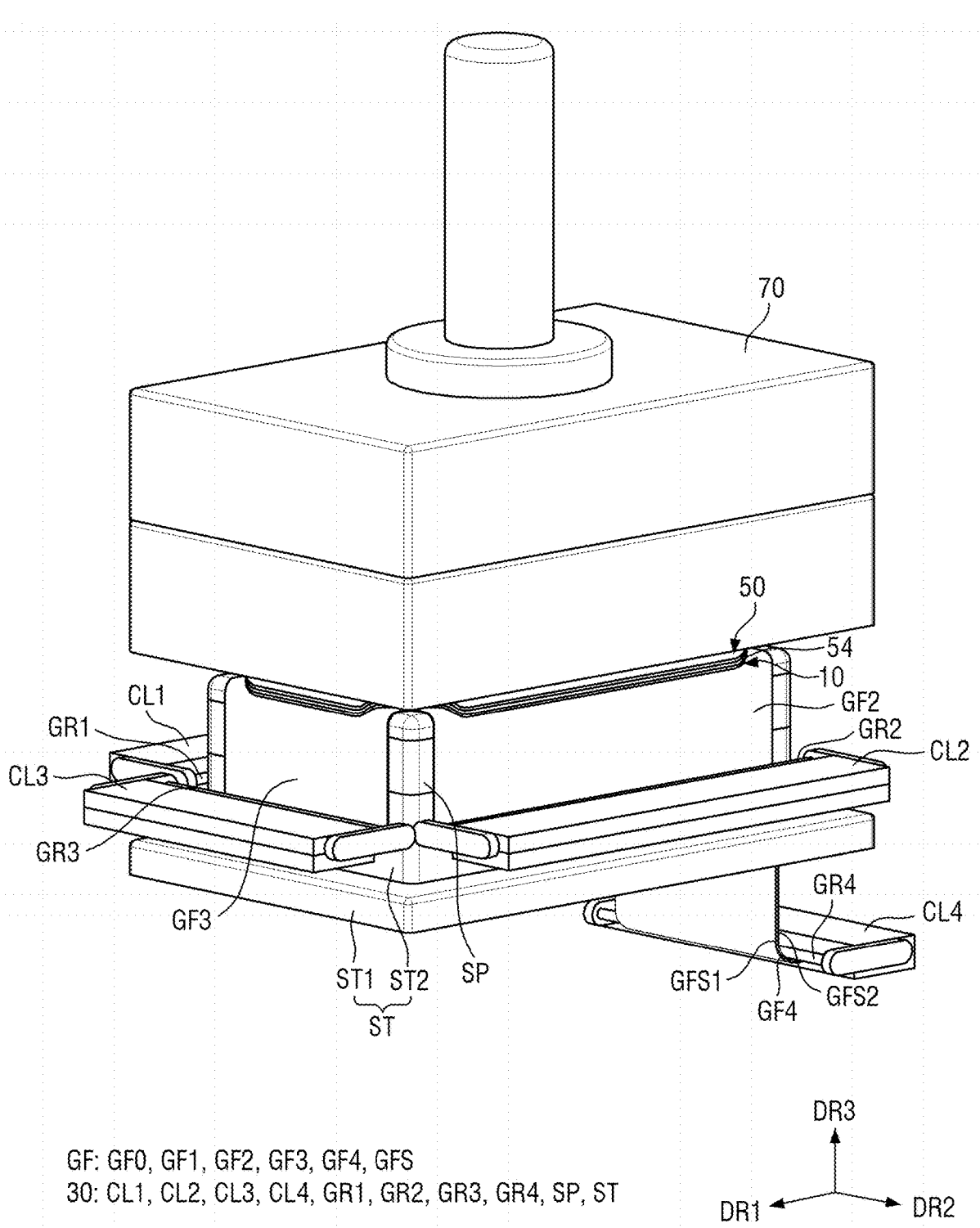

Thereafter referring to FIGS. 14, 20, and 21, the curved window 50 is laminated onto the curved display panel 10 via a panel window coupling member 54 (step S40).

The curved window 50 may include a main window area which corresponds to the main display area DA0 of the curved display panel 10, and window edge areas which correspond to the edge areas of the curved display panel 10. The curved window 50 may have substantially identical stereoscopic shape to that of the curved display panel 10. The main window area of the curved window 50 may be disposed to overlap the main display area DA0 of the curved display panel 10 and may have substantially equal size to the main display area DA0 in a plan view, and the window edge areas of the curved window 50 may have a greater size than the edge areas of the curved display panel 10 in a plan view and may overlap the edge areas of the curved display panel 10 from outside the edge areas of the curved display panel 10.

Step S40 may include placing the panel window coupling member 54 on the curved display panel 10, placing the curved window 50 on the curved display panel 10 (i.e., on a first side of the curved display panel 10 in the third direction DR3), and laminating the curved window 50 and the curved display panel 10 together via the panel window coupling member 54 with the use of (or by using) a lamination device 70, as illustrated in FIG. 21. Once pressure is applied to a first surface (or the top surface) of the curved window 50 with the lamination device 70, the main window area of the curved window 50 and the main display area DA0 of the curved display panel 10 may be coupled together first, and a flexible material from a shaping pad SP of a supporting device 30 may move in the horizontal direction (i.e., the first direction DR1 and/or the second direction DR2) due to the pressure applied via the lamination device 70. As a result, the window edge areas of the curved window 50 and the edge areas of the curved display panel 10 may be coupled together.

The panel window coupling member 54 may include an adhesive that is curable by UV light. The panel window coupling member 54 may include, for example, a UV-curable optically-clear coupling member. Examples of the UV-curable optically-clear coupling member may include an optically clear adhesive and an optically clear resin, but the disclosure is not limited thereto.

Figure 22:
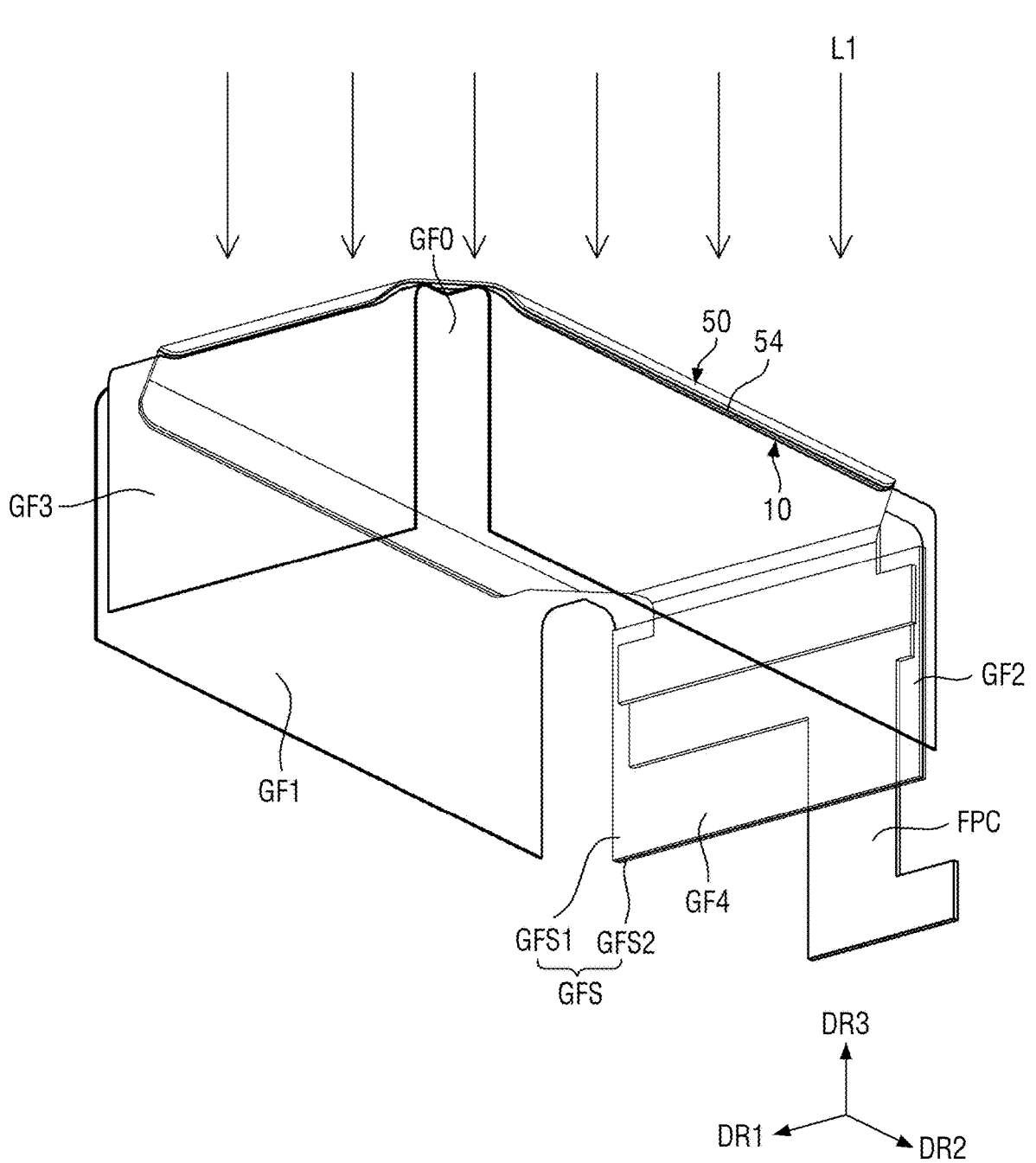

Thereafter, referring to FIGS. 14 and 22, the panel window coupling member 54 is cured by applying first light L1 to the first surface (or the top surface) of the curved window 50 laminated onto the curved display panel 10 (step S50). The first light L1 may be light of a UV wavelength range. As the first light L1 is applied, the panel window coupling member 54 may be UV-cured.

The first coupling member 51 may be cured by the first light L1 during the UV-curing of the panel window coupling member 54. As a result, the adhesion between the curved display panel 10 and the main film portion GF0 and the first, second, and third film portions GF1, GF2, and GF3 of the guide film GF may decrease.

On the contrary, since the second coupling member 52 includes a UV-incurable adhesive, the second coupling member 52 may not be cured at all, or may be cured only slightly, by UV light applied during the UV-curing of the panel window coupling member 54. Thus, the adhesion between the first UV absorption pattern GFS1 and the curved display panel 10 may not change. Since the first UV absorption pattern GFS1 includes a UV absorbing material, the first UV absorption pattern GFS1 can prevent UV light from arriving at the first coupling member 51 between the fourth film portion GF4 and the first UV absorption pattern GFS1.

Accordingly, even if the application of UV light is continued until the removal of the fourth film portion GF4 and UV absorption patterns GFS that include the first UV absorption pattern GFS1 and a second UV absorption pattern GFS2, the first UV absorption pattern GFS1 may remain attached onto the curved display panel 10, and the fourth film portion GF4 may remain attached onto the first UV absorption pattern GFS1.

Figure 23:
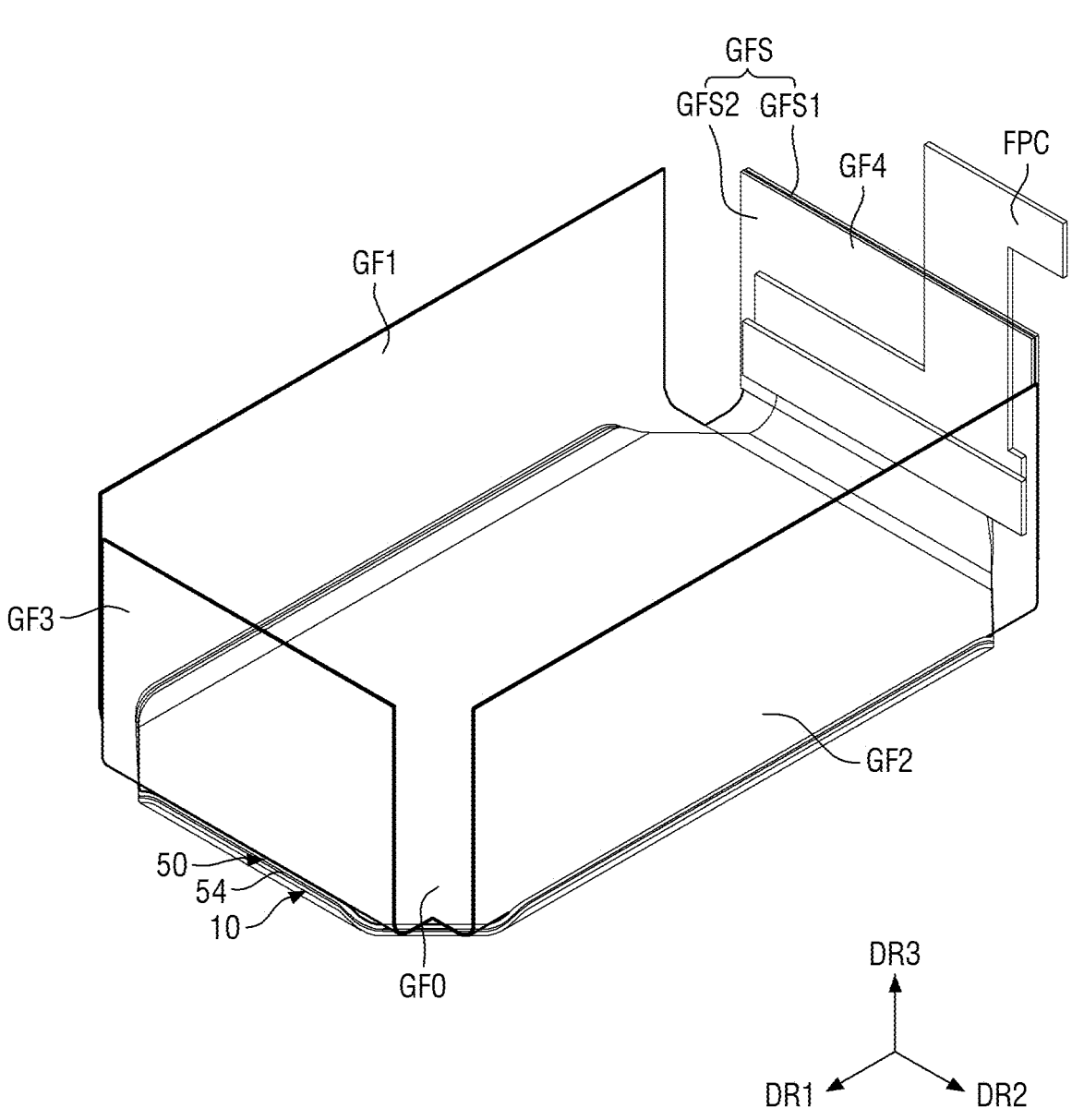
Figure 24:
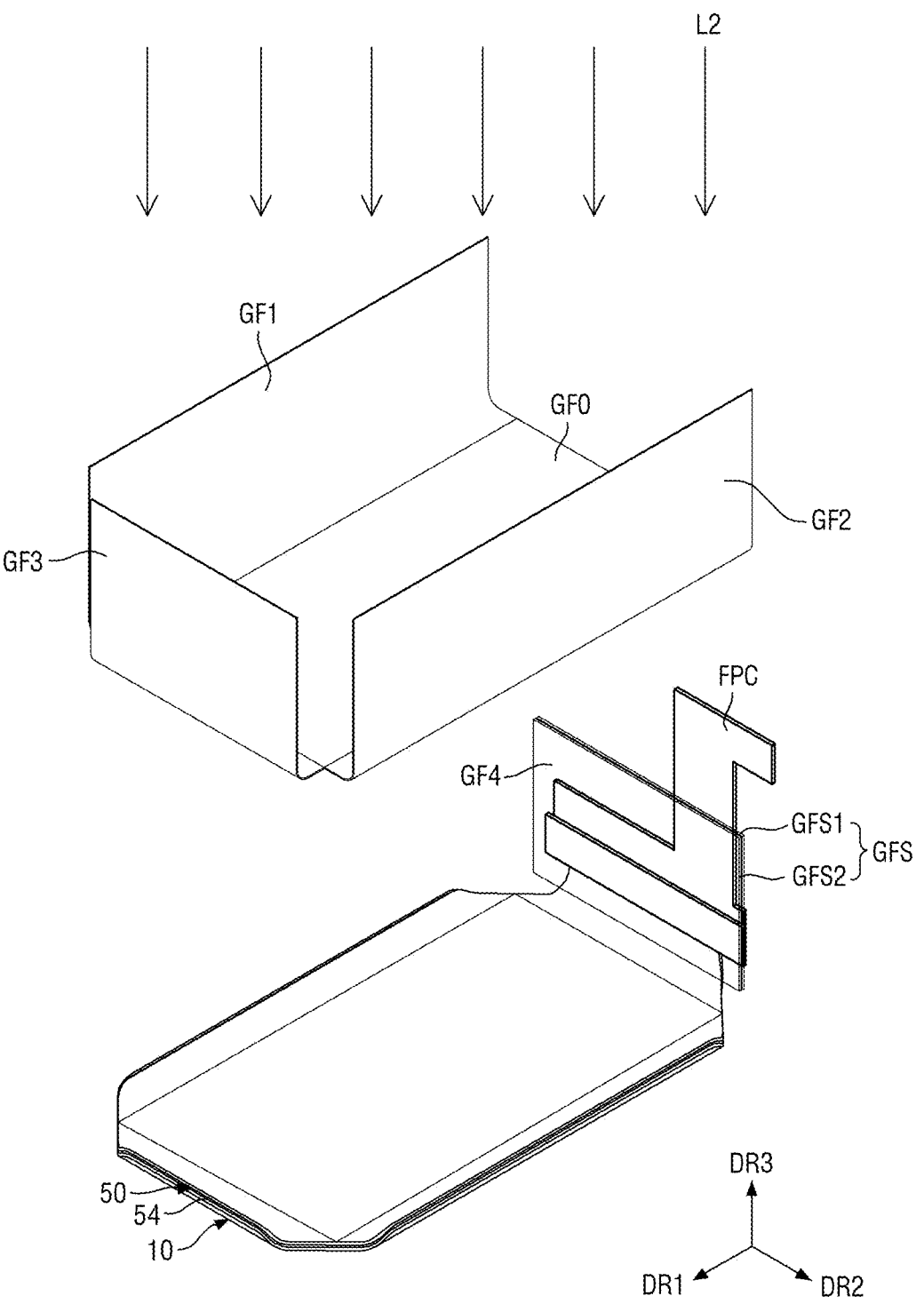

Thereafter, referring to FIGS. 14, 23, and 24, the entire guide film GF except for the fourth film portion GF4 is removed (step S60).

Step S60 may be performed in case that a structure including the guide film GF, the curved display panel 10, the panel window coupling member 54, and the curved window 50 is turned upside down in the third direction DR3, as illustrated in FIG. 23. In case that the structure is turned upside down in the third direction DR3, the direction in which the first, second, third, and fourth film portions GF1, GF2, GF3, and GF4 extend from the main film portion GF0 may be the third direction DR3, and the curved display panel 10 may be located above the curved window 50.

As illustrated in FIG. 24, step S60 may be performed by applying second light L2 from above the curved display panel 10. The second light L2 may be light of a UV wavelength range.

The first coupling member 51 may be curved by the second light L2 applied during the removal of the main film portion GF0 and the first, second, and third film portions GF1, GF2, and GF3 of the guide film GF in step S60. As a result, the adhesion between the curved display panel 10 and the main film portion GF0 and the first, second, and third film portions GF1, GF2, and GF3 of the guide film GF may decrease.

On the contrary, since a third coupling member 53 includes a UV-incurable adhesive, the third coupling member 53 may not be cured at all, or may be cured only slightly, by the second light L2 applied during the removal of the main film portion GF0 and the first, second, and third film portions GF1, GF2, and GF3 of the guide film GF, i.e., step S60. Thus, the adhesion between the second UV absorption pattern GFS2 and the curved display panel 10 may not change. Since the second UV absorption pattern GFS2 includes a UV absorbing material, the second UV absorption pattern GFS2 can prevent UV light from arriving at the first coupling member 51.

In steps S50 and S60, the first coupling member 51 may be cured so that the adhesion between the curved display panel 10 and the guide film GF may decrease. As a result, there is no adhesion, or only slight adhesion, between the curved display panel 10 and the guide film GF. Accordingly, as already mentioned above, the main film portion GF0 and the first, second, and third film portions GF1, GF2, and GF3 of the guide film GF can be easily separated and peeled off from the fourth film portion GF4 along an incision line ICL formed along the boundary between the fourth film portion GF4 and the main film portion GF0.

The first UV absorption pattern GFS1 may remain attached to the fourth edge area of the curved display panel 10, the fourth film portion GF4 may remain attached to the first UV absorption pattern GFS1, and the second UV absorption pattern GFS2 may remain attached to the fourth film portion GF4.

Figure 25:
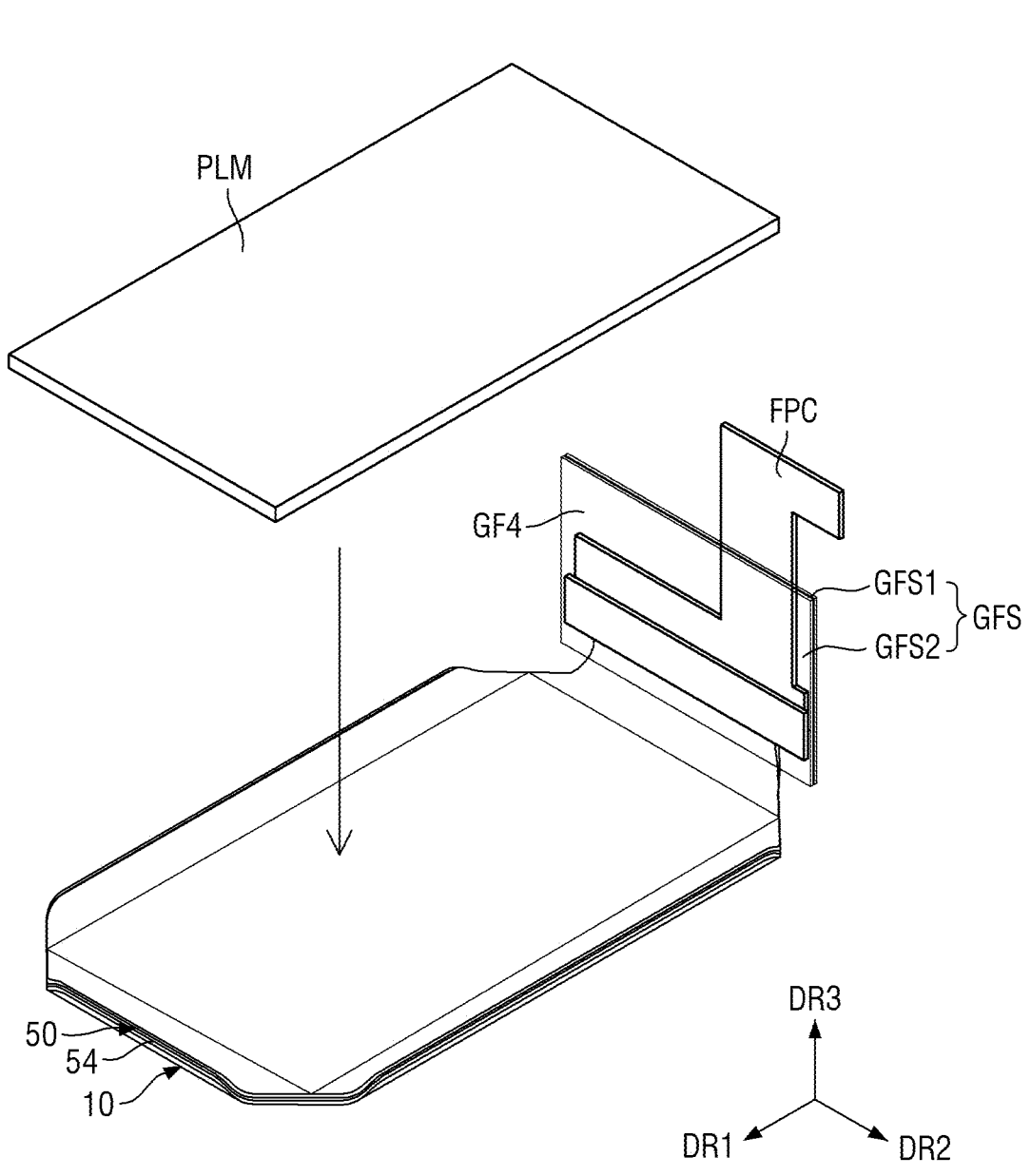

Thereafter, referring to FIGS. 14 and 25, a panel bottom sheet PLM is attached to (or disposed on) the top surface of the curved display panel 10 that is opposite to the surface of the curved display panel 10 where the curved window 50 is attached (step S70).

The panel bottom sheet PLM may be attached onto the main display area DA0 of the curved display panel 10. The panel bottom sheet PLM may include at least one functional layer. The function layer may be a layer that performs a heat dissipation function, an electromagnetic wave shielding function, a grounding function, a buffering function, a strength reinforcing function, a supporting function, and/or a digitizing function. The functional layer may be a sheet layer, a film layer, a thin-film layer, a coating layer, a panel, or a plate. The functional layer may be formed as a single layer or a stack of multiple thin films or coating layers. The functional layer may be, for example, a supporting member, a heat dissipation layer, an electromagnetic wave shielding layer, a shock absorbing layer, or a digitizer.

Figure 26:
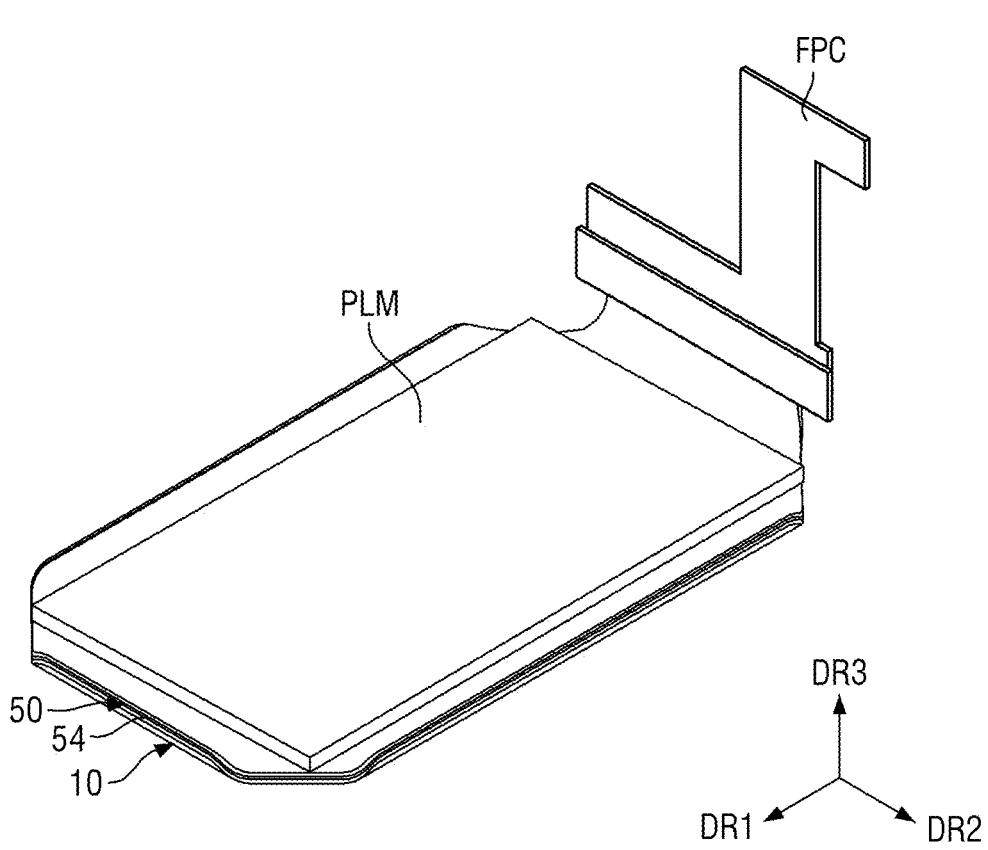

Thereafter, referring to FIGS. 14 and 26, the fourth film portion GF4 and the UV absorption patterns GFS are removed from the curved display panel 10 (step S80).

The second coupling member 52 has weak adhesion between the first UV absorption pattern GFS1 and the fourth edge area of the curved display panel 10. Accordingly, the first UV absorption pattern GFS1 can be easily removed from the fourth edge area of the curved display panel 10.

After the removal of the main film portion GF0 and the first, second, and third film portions GF1, GF2, and GF3, i.e., step S60, the first UV absorption pattern GF1 may remain attached onto the fourth edge area of the curved display panel 10, the fourth film portion GF4 may remain attached onto the first UV absorption pattern GFS1, and the second UV absorption pattern GFS2 may remain attached onto the fourth film portion GF4 until the second sub-non-display area NDA42 which is the bending part of the curved display panel 10 is bent. As a result, the second sub-non-display area NDA42 of the curved display panel 10 can be prevented from being untimely bent after the removal of the main film portion GF0 and the first, second, and third film portions GF1, GF2, and GF3.

If the second sub-non-display area NDA42 of the curved display panel 10 is bent after step S60 and before step S70, signal lines that pass through the second sub-non-display area NDA42, i.e., signal lines that pass through the first pad area PA1 from display areas (DA0, DA1, DA2, DA3, and DA4) of FIGS. 15 and 16, may crack and/or may be disconnected. However, in the method of FIG. 14, since the first UV absorption pattern GFS1 remains attached onto the fourth edge area of the curved display panel 10, the fourth film portion GF4 remains attached onto the first UV absorption pattern GFS1, and the second UV absorption pattern GFS2 remains attached onto the fourth film portion GF4 until the second sub-non-display area NDA42 which is the bending part of the curved display panel 10 is bent after step S60, the second sub-non-display area NDA42 of the curved display panel 10 can be prevented from being untimely bent.

Figure 27:
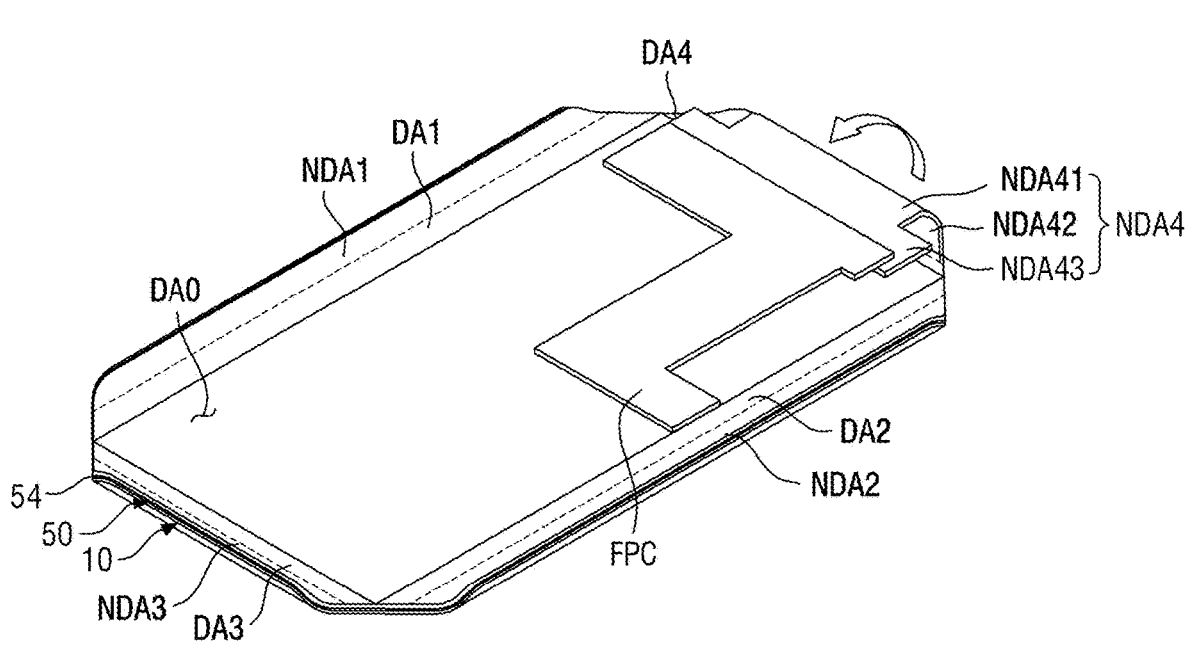

Thereafter, referring to FIGS. 14 and 27, the second sub-non-display area NDA42 which is the bending part of the curved display panel 10 is bent (step S90). The second sub-non-display area NDA42 which is the bending part of the curved display panel 10 is bent in the thickness direction of the guide film GF. In this case, the first and third sub-non-display areas NDA41 and NDA43 may be disposed to overlap each other in the thickness direction of the guide film GF. The printed circuit film FPC which is disposed in the third sub-non-display area NDA43 may be disposed to overlap the main display area DA0.

A method of fabricating a display device according to another embodiment of the disclosure will hereinafter be described.

Figure 28:
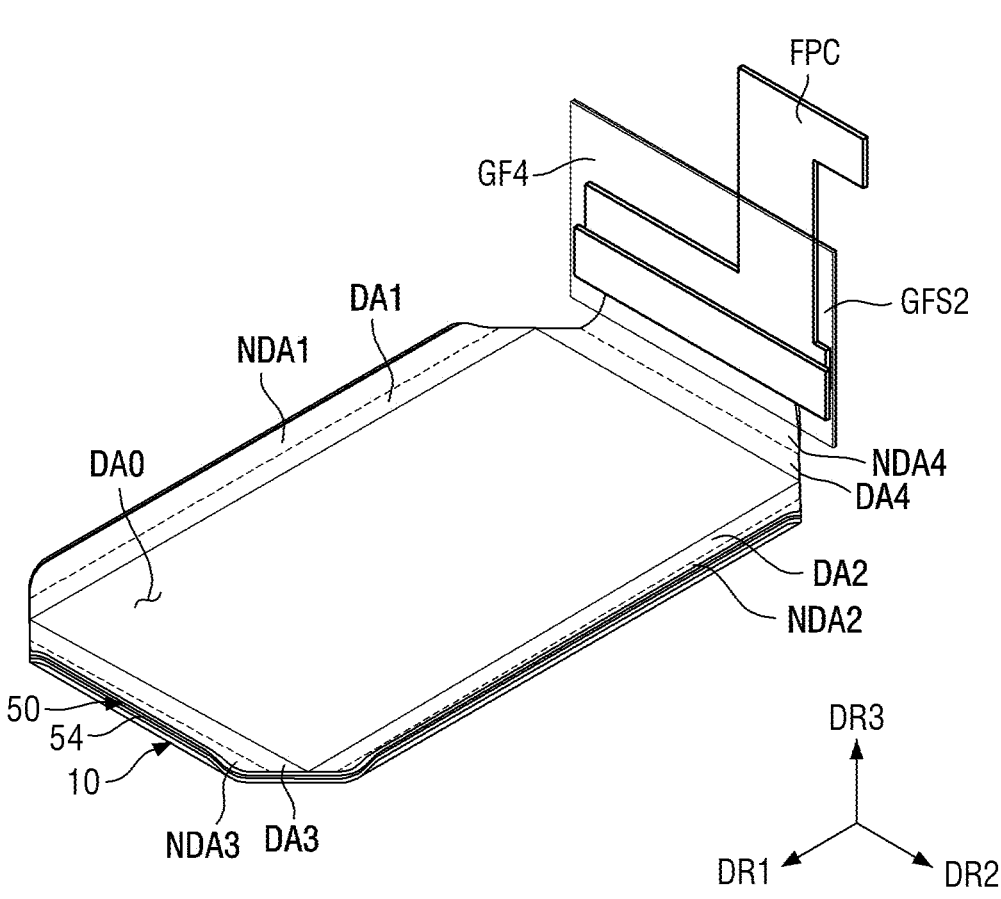
FIGS. 28 through 30 are schematic perspective views illustrating a method of fabricating a display device according to an embodiment of the disclosure.
Figure 29:
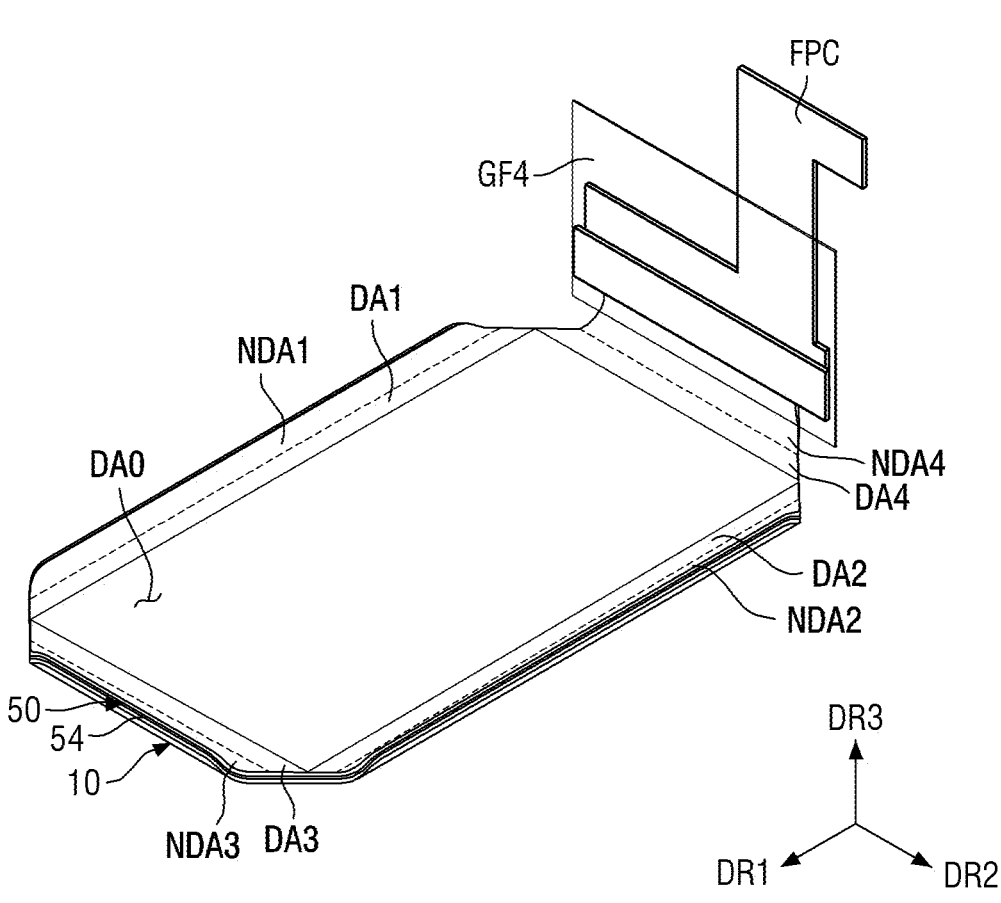
Figure 30:
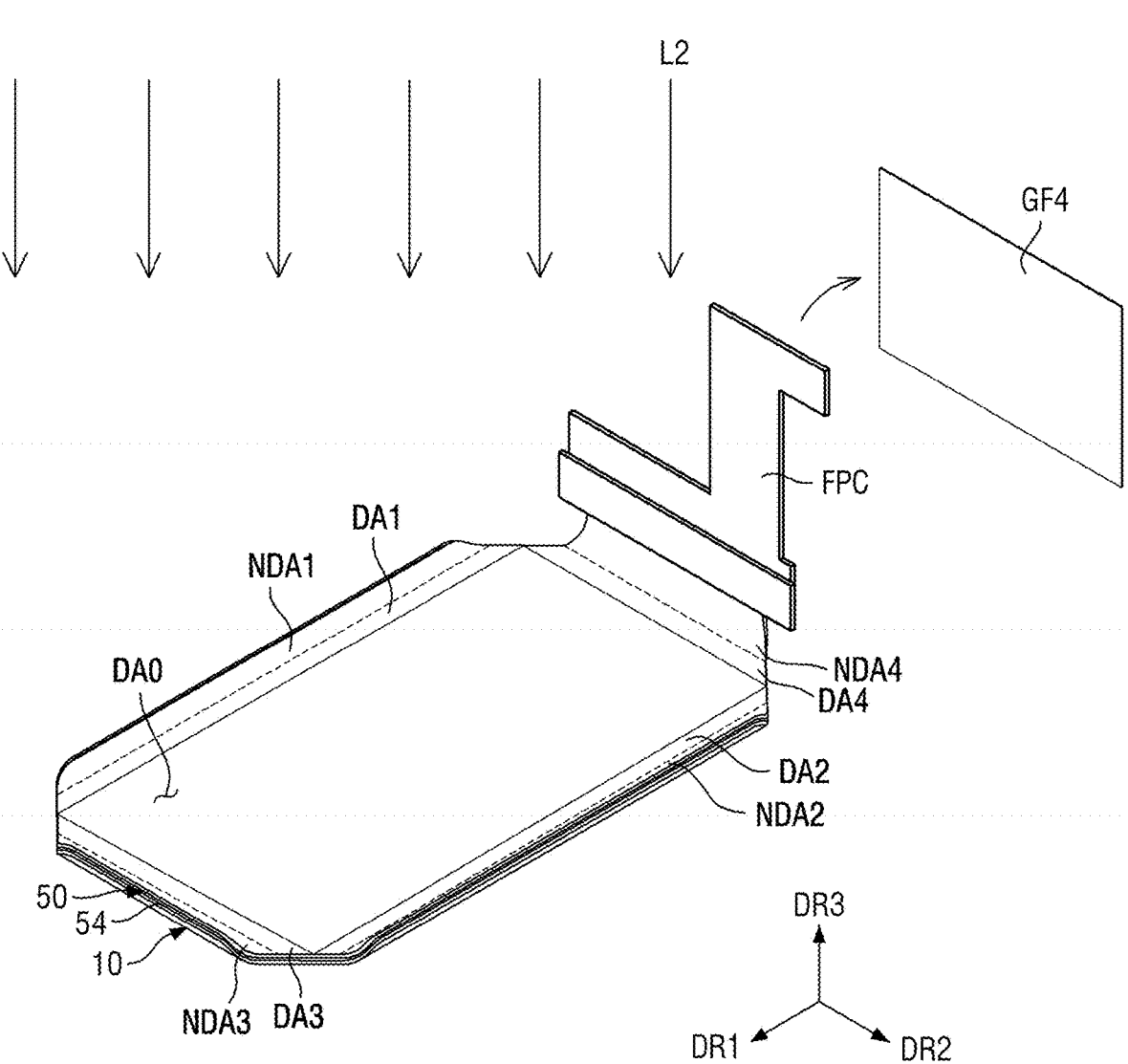

FIGS. 28 through 30 are schematic perspective views illustrating a method of fabricating a display device according to an embodiment of the disclosure.

In the method of FIGS. 28 through 30, the guide film GF_1 of FIG. 6 may be used.

The method of FIGS. 28 through 30 differs from the method of FIG. 14 at least in that a first UV absorption pattern GFS1 is not provided and that after the attachment of a panel bottom sheet PLM, i.e., step S70, a second UV absorption pattern GFS2 is removed from a fourth film portion GF4 and then the fourth film portion GF4 is removed by applying second light L2.

The UV curing of a panel window coupling member 54 may be omitted from the method of FIGS. 28 through 30.

Thus, the first UV absorption pattern GFS1 which prevents the first light L1 of FIG. 22 applied in a top-to-bottom direction from arriving at a first coupling member 51, may not be provided.

Descriptions of other aspects or features of the method of FIGS. 28 through 30 will be omitted.

Although embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a guide film, comprising:
   forming a guide film to include:
      a main film portion,
      a first film portion disposed on a first side of the main film portion in a first direction;
      a second film portion disposed on a second side of the main film portion in the first direction;
      a third film portion disposed on a first side of the main film portion in a second direction that intersects the first direction; and
      a fourth film portion disposed on a second side of the main film portion in the second direction;
   forming an incision line to include a plurality of incision patterns along a boundary between the main film portion and the fourth film portion; and
   attaching ultraviolet absorption patterns onto the fourth film portion.

2. The method of claim 1, wherein
   the plurality of incision patterns penetrate the boundary between the main film portion and the fourth film portion in a thickness direction of the guide film, and
   the ultraviolet absorption patterns include an ultraviolet absorbing material.

3. The method of claim 2, wherein the ultraviolet absorption patterns are disposed on and below the fourth film portion.

* * * * *